(12) United States Patent
Udagawa

(10) Patent No.: US 6,645,302 B2
(45) Date of Patent: Nov. 11, 2003

(54) VAPOR PHASE DEPOSITION SYSTEM

(75) Inventor: Takashi Udagawa, Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 146 days.

(21) Appl. No.: 09/842,045

(22) Filed: Apr. 26, 2001

(65) Prior Publication Data

US 2001/0035530 A1 Nov. 1, 2001

Related U.S. Application Data

(60) Provisional application No. 60/237,728, filed on Oct. 5, 2000.

(30) Foreign Application Priority Data

Apr. 26, 2000 (JP) ........................................ 2000-126115
Sep. 19, 2000 (JP) ........................................ 2000-283556

(51) Int. Cl.$^7$ .............................................. C23C 16/00
(52) U.S. Cl. ................................. 118/715; 427/255.34
(58) Field of Search ....................... 118/715; 427/248.1, 427/255.28, 255.34

(56) References Cited

U.S. PATENT DOCUMENTS 5,653,807 A * 8/1997 Crumbaker ................. 118/715
5,714,194 A * 2/1998 Komai et al. ................. 427/81
5,888,579 A * 3/1999 Lun ............................. 427/8
6,110,283 A * 8/2000 Yamamuka et al. ........ 118/715

OTHER PUBLICATIONS

E. J. Thrus et al., "Compositional Transients In MOCVD Grown II–V–Heterostructures", Journal of Crystal Growth, vol. 68, 412–421 (1984).

M. W. Jones et al., "MOCVD Growth of GaAs/Ga$_{1-x}$Al$_x$As Epitaxial Layers for Monolithic Optoelectronic Devices", Journal of Crystal Growth, vol. 68, 466–473 (1984).

* cited by examiner

*Primary Examiner*—Sara Crane
(74) *Attorney, Agent, or Firm*—Sughrue Mion, PLLC

(57) ABSTRACT

An object of the present invention is to reduce variance in the flow rates of source gasses and inconsistency in the mixing ratio of the source gasses when the flow paths of the source gasses are switched in a vent/run-type piping system of a vapor deposition apparatus. In a vapor deposition apparatus, a run line for mixing one or more sources with a carrier gas and for supplying the resultant gas to a vapor deposition region; a vent line for allowing the sources to detour away from the vapor deposition region and exhausting the sources; and a mechanism for switching the paths of the sources from the vapor deposition region to the vent line are provided. The paths of the sources are switched from the vent line to the vapor deposition region when the mixing ratio of the sources becomes consistent in the run line.

4 Claims, 16 Drawing Sheets

VAPOR PHASE DEPOSITION SYSTEM

CROSS REFERENCE TO RELATED APPLICATIONS

This application is an application filed under 35 U.S.C. §111(a) claiming benefit pursuant to 35 U.S.C. §119(e)(1) of the filing date of Provisional Application 60/237,728 filed Oct. 5, 2000 pursuant to 35 U.S.C. §111(b).

FIELD OF THE INVENTION

The present invention relates to a vapor deposition apparatus for forming a semiconductor stacked layer structure, and more particularly to a vapor deposition apparatus that is suitable for forming a semiconductor heterojunction interface where there is a sharp change in composition. Also, the present invention relates to a vapor deposition process using the vapor deposition apparatus; a stacked layer structure produced by the process; a field effect transistor comprising the stacked layer structure; a semiconductor Hall device comprising the stacked layer structure; and a semiconductor light-emitting device comprising the stacked layer structure.

BACKGROUND OF THE INVENTION

Conventionally, an epitaxial stacked layer structure employed in light-emitting devices of singlehetero (SH)- or doublehetero (DH)-structure or in two-dimensional electron gas field effect transistors (TEGFETs); or a structure similar to the stacked layer structure is formed by a vapor deposition technique such as metal-organic chemical vapor deposition (MOCVD) (see Solid State Electron., vol. 43 (1999), pp. 1577–1589). Particularly, when a stacked layer structure employed in a TEGFET is formed, composition must change sharply at the heterojunction interface in order to efficiently exert the effect of two-dimensional electron gas (TEG) (see Nippon Butsuri Gakkai ed., "HANDOTAICHOKOSHI NO BUTSURI TO OYO," 4th printing of 1st edition, published on Sep. 30, 1986 by Baifukan, pp. 139–145).

A conventional vapor deposition apparatus in which semiconductor crystal layers, for example, group III-V compound semicoriductor crystal layers, are vapor-grown by MOCVD does not include a piping system through which a group III or group V element source passes constantly, regardless of whether or not the source is necessary for the growth of the crystal layers (see J. Crystal Growth, vol. 55 (1981), pp. 64–73, 92–106, 164–172, and 213–222). The conventional vapor deposition apparatus has a piping system so that an element source or a dopant source is supplied to a vapor deposition region through the piping only when the supply of the source is necessary. Therefore, in the apparatus, the supply of the source gas, which is temporarily unnecessary for the vapor-growth of the crystal layers, is temporarily stopped by means of valve operation.

In the piping system of such a conventional vapor deposition apparatus, when the source gas becomes necessary again, the valve must be opened to resume supply of the gas to the vapor deposition region. However, when the supply of the source gas is resumed after the supply is stopped, the flow rate of the gas varies temporarily in accordance with variance in pressure in the piping by the opening of valve. In addition, the purity of the source gas lowers, since the gas is confined or retained in the piping. Temporal variance in the flow rate of the source gas and lowering of the purity of the gas cause variance in compositional proportions of elements constituting the crystal layers. As a result, forming a junction interface where there is a sharp change in composition is difficult. Therefore, such a conventional vapor deposition apparatus having the aforementioned piping system is inappropriate for vapor-growth of a stacked layer structure, which must have a heterojunction interface where the composition changes sharply employed in a TEGFET.

In order to solve the problems involved in the piping system of such a vapor deposition apparatus and to form a semiconductor junction interface where the composition changes sharply, there has been proposed a piping system to the supply a source gas called a vent/run system, which has a mechanism that enables constant flow of a source gas and instantaneous switching of the gas supplied to a vapor deposition region (see J. Crystal Growth, vol. 68 (1984), pp. 412–421 and 466–473; and "III-V ZOKU KAGOBUTSU HANDOTAI," edited by Isamu Akasaki, published on May 20, 1994 by Baifukan, 1st edition, pp. 68–70). A vent line (exhaust line) is provided to constantly supply a source gas to the outside of a vapor deposition region in advance to maintain a constant flow rate of the gas, regardless of whether or not the gas is necessary for vapor-growth of the intended crystal layers. A run line (source supply line) is connected directly to the vapor deposition region, and is provided for supplying the source gas necessary to the region for vapor-growth of the intended crystal layers, the flow of the source gas being switched from the vent line to the run line. That is, unlike the conventional piping system containing only a source supply line, the vent/run system includes the vent line through which the source gas passes constantly.

FIG. 1 illustrates a vent/run-type source gas supply piping system. Source gas passages 13, 14, and 15 are provided for passing source gasses 10, 11, and 12, respectively. Each source gas consists of a gas source or gas accompanied by vapor of the source. The flow rates of the source gasses 10 through 12 passing through the passage 13 through 15 are regulated by flowmeters 16, 17, and 18. Conventionally, the passages 13 through 15 corresponding to the respective source gasses are connected to a run line 25 and a vent line 26 via two-way valves 19 through 24. Whether or not a fluid is passed through a single line is determined through an opening and closing operation of the corresponding two-way valve. The run line 25 is connected directly to a vapor deposition region in which crystal layers are formed. The vent line 26 is detoured away from the vapor deposition region and connected directly to an exhaust system in which exhaust of gas is carried out.

Switching of the flow of the source gasses 10 through 12 from the run line 25 to the vent line 26 and vice versa is carried out by an opening and closing operation of the flow path switching valves 19 through 24 provided on the source gas passages 13 through 15. For example, in order to switch the path through which the source gas 10 flows via the source gas passage 13 from the vent line 26 to the run line 25, the two-way valve 22 is closed and, simultaneously, the two-way valve 19 is opened. Usually, the two-way valves 19 and 22 are not opened simultaneously; nor are the two-way valves 20 and 23 and the two-way valves 21 and 24.

The conventional vent/run-type piping system consists of a combination of a single run line (i.e., the line 25) and a single vent line (i.e., the line 26). In the vent/run-type piping system consisting of such a combination; i.e., a single vent/run-type piping system, the flow rate of the source gas varies periodically immediately after the path of a source gas is switched from the vent line 26 to the run line 25. Variance in the flow rate of the source gas gradually decreases while the gas is supplied through the line 25 to a vapor deposition region, but the amount of the gas supplied to the vapor deposition region still varies. Variance in the amount of the gas supplied causes variance in the compositional proportions of elements constituting crystal layers in a vertical direction with respect to the layers, and also impedes sharp change in composition at a heterojunction interface of the crystal layers.

Problems involved in the conventional single vent/run-type source supply piping system will be described in more detail with reference to FIG. 1. For example, suppose when two source gasses 10 and 11 are passed through the run line 25 at a constant flow rate via the source gas passages 13 and 14 to thereby vapor-grow a crystal layer, and subsequently a mixed-crystal layer is vapor-grown from the three source gasses 10 through 12. In such a case, in order to grow the mixed-crystal layer, the path of the source gas 12 must be switched from the vent line 26 to the run line 25 by an opening and closing operation of the two-way valves 21 and 24. Immediately after the path is switched, the flow rate of the source gas 12 varies periodically; i.e., the flow rate becomes inconsistent. Inconsistency in the flow rate of the source gas 12 causes inconsistency in compositional proportions of elements constituting the mixed-crystal layer, the elements including the element of the source gas 12. As a result, obtaining a sharp change in composition at the heterojunction interface between the layers is difficult.

In order to vapor-grow the mixed-crystal layer from the three source gasses 10 through 12 in the conventional single vent/run-type source supplying piping system shown in FIG. 1, even when the paths of the source gasses 10 through 12 are simultaneously switched from the vent line 26 to the run line 25, the flow rate of each of the gasses varies in the line 25. This is because eliminating differences in pressure between the lines 25 and 26 is difficult. Briefly, when the flow of the source gas is switched from the vent line to the run line, the flow rate of the respective source gas varies in the run line 25. Therefore, when the source gasses, the flow rate of each having been varied, are supplied to the vapor deposition region, a mixed-crystal layer having a consistent composition cannot be grown.

The aforementioned problems are attributed to variance in the flow rate of the source gas and inconsistency in mixing proportions of the source gasses that occur during switching of the paths in the conventional single vent/run-type source supply piping system. An object of the present invention is to solve such problems.

SUMMARY OF THE INVENTION

In order to solve the aforementioned problems, the present inventor has performed extensive studies and has found that, when a piping structure in which the path of a mixture of source gasses is switched immediately after the mixing proportions of the gasses becomes consistent is provided, and the gas mixture is supplied to a vapor deposition region, a junction interface at which composition profile changes sharply can be consistently formed. The present invention has been accomplished on the basis of this finding. Accordingly, the present invention provides:

(1) a vapor deposition apparatus for producing a stacked layer structure in which semiconductor crystal layers are laminated on a substrate material, which apparatus comprises a first run line for mixing one or more vapor deposition sources with a carrier gas in advance and passing the resultant source mixture; a second run line for supplying the source mixture to a vapor deposition region; a vent line for allowing the source mixture to detour away from the vapor deposition region and discharging the source mixture; and a line switching mechanism for switching the flow of the source mixture from the first run line to either the second run line or the vent line;

(2) a vapor deposition apparatus according to (1) described above, wherein the vent line has a mechanism for passing a carrier gas;

(3) a vapor deposition apparatus according to (1) or (2) described above, wherein the first run line has two or more of flow path switching mechanisms for switching the flow of source mixture to either the second run line or the vent line;

(4) a vapor deposition apparatus according to any one of (1) through (3) described above, wherein the apparatus comprises an apparatus for measuring differences in pressure between the vent line and the first or second run line;

(5) a vapor deposition apparatus according to any one of (1) through (4) described above, wherein the vapor deposition sources contain a hydride of group V or VI element;

(6) a process for the vapor deposition of a stacked layer structure by use of a vapor deposition apparatus as recited in any one of (1) through (5) described above, which process comprises switching the flow of the vapor deposition sources that have been mixed in the first run line in advance from the vent line to the second run line after the mixing proportions of the sources have become consistent;

(7) a process for vapor-growth of a stacked layer structure by use of a vapor deposition apparatus as recited in any one of (1) through (5) described above, which process comprises switching the flow of the vapor deposition sources that have been mixed in the first run line in advance from the vent line to. the second run line when a difference in pressure between the first and second run lines is $5 \times 10^2$ Pa or less;

(8) a vapor deposition process according to (6) or (7) described above, wherein a stacked layer structure is produced through metal-organic chemical vapor deposition;

(9) a stacked layer structure produced through a vapor deposition process as recited in any one of (6) through (8) described above;

(10) a stacked layer structure according to (9) described above, which is a multi-stacked layer structure having a heterojunction structure;

(11) a stacked layer structure according to (10) described above, which is a multi-stacked layer structure for producing a field effect transistor;

(12) a stacked layer structure according to (11) described above, wherein the multi-stacked layer structure for producing a field effect transistor has a heterojunction between gallium indium phosphide ($Ga_XIn_{1-X}P$: $0 \leq X \leq 1$) and gallium indium arsenide ($Ga_YIn_{1-Y}As$: $0 \leq Y \leq 1$);

(13) a stacked layer structure according to (11) described above, wherein the multi-stacked layer structure for producing a field effect transistor has a heterojunction between aluminum indium arsenide ($Al_XIn_{1-X}As$: $0<X \leq 1$) and gallium indium arsenide ($Ga_YIn_{1-Y}As$: $0 \leq Y \leq 1$);

(14) a stacked layer structure according to (10) described above, which is a multi-layer structure for producing a group III-V compound semiconductor Hall device;

(15) a stacked layer structure according to (14) described above, which is a multi-layer structure having a heterojunction between indium phosphide (InP) and gallium indium arsenide ($Ga_YIn_{1-Y}As$: $0 \leq Y \leq 1$);

(16) a stacked layer structure according to (10) described above, which is a multi-layer structure for producing a group III nitride semiconductor light-emitting device;

(17) a stacked layer structure according to (16) described above, which is a multi-layer structure having a heterojunction between aluminum gallium nitride ($Al_XGa_{1-X}N$: $0 \leq X \leq 1$) and aluminum gallium indium nitride ($(Al_XGa_{1-X})_YIn_{1-Y}N$: $0 \leq X \leq 1$, $0 \leq Y < 1$);

(18) a field effect transistor comprising a stacked layer structure as recited in (11) described above;

(19) a field effect transistor according to (18) described above, which comprises a stacked layer structure containing an active layer formed from gallium indium arsenide ($Ga_YIn_{1-Y}As$);

(20) a group III-V compound semiconductor Hall device comprising a stacked layer structure as recited in (14) described above;

(21) a group III-V compound semiconductor Hall device according to (20) described above, which comprises a stacked layer structure as recited in (15) described above;

(22) a group III nitride semiconductor light-emitting device comprising a stacked layer structure as recited in (16) described above; and

(23) a group III nitride semiconductor light-emitting device according to (22) described above, which comprises a stacked layer structure as recited in (17) described above.

BRIEF DESCRIPTION OF THE DRAWINGS

In FIG. 20, GaInAs represents a probe including an InP/GaInAs Hall device of the present invention; and GaAs represents a probe including a conventional GaAs Hall device.

DESCRIPTION OF THE PREFERRED EMBODIMENTS

Figure 2:
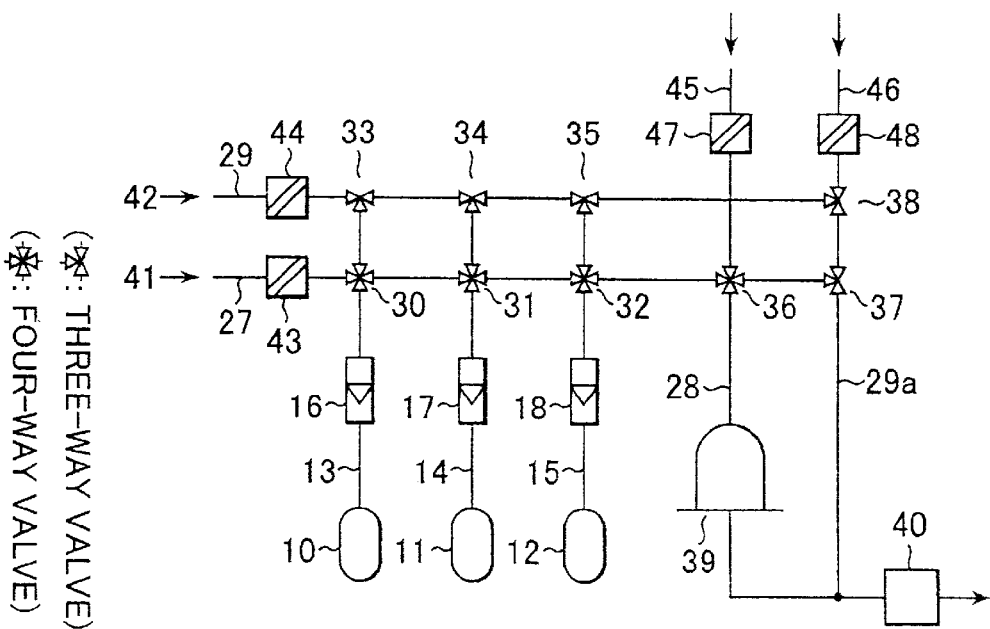
FIG. 2 shows a schematic diagram of a piping system of the present invention.

FIG. 2 is a schematic diagram showing a piping system of the present invention. A characteristic feature of the piping system of the present invention resides in a structure including a plurality of run lines (a first run line 27 and a second run line 28), and a plurality of vent lines (a first vent line 29 and a second vent line 29a, which correspond to the first and second run lines 27 and 28, respectively). In other words, a characteristic feature of the piping system resides in a structure including a double vent/run mechanism, instead of a conventional single vent/run mechanism. According to the piping system of the present invention, source gasses are supplied to a vapor deposition region 39 via the two-step run lines 27 and 28. The double vent/run mechanism of the present invention is suitably employed in a vapor deposition apparatus for producing a group III-V or II-VI compound semiconductor crystal by reduced-pressure MOCVD, atmospheric-pressure (approximately atmospheric-pressure) MOCVD, or halogen or hydride vapor phase epitaxy (VPE). In addition, the double vent/run mechanism is suitably employed in a vapor deposition apparatus for producing a mixed crystal of silicon (Si) and germanium (Ge).

The first run line 27 is provided for gathering, in advance, source gasses of elements constituting crystal layers and passing the gasses. All the source gasses necessary for the vapor-growth of the crystal layers are passed, in advance, through the first run line 27 by switching the flow of the gasses from the first vent line 29 by an opening and closing operation of four-way valves 30 through 32 and three-way valves 33 through 35. Operation of the three-way valves are synchronized with operation of the four-way valves, which are employed for switching between two lines. When the valve is opened, one line is connected to the other line, whereas when the valve is closed, connection between the two lines is closed. A three-way valve; i.e., a trifurcated valve, has a mechanism for adding a fluid to a one-way line to pass the fluid through the line. When the three-way valve is opened, a first line is connected to a second line crossing the first line, whereas when the valve is closed, a fluid passing through the second line is not passed through the first line. For example, when a mixed crystal of aluminum gallium arsenide ($Al_XGa_{1-X}As$: $0<X<1$) is vapor-grown by, for example, MOCVD, source gasses 10, 11, and 12 of elements constituting the crystal; i.e., aluminum (Al), gallium (Ga), and arsenic (As), are passed through the first run line 27 in advance to attain a desired aluminum proportion (=X). When the flow of the resultant gas mixture is switched from the first vent line 29 to the first run line 27 by an opening of the four-way valves 30, 31, and 32 and closing of the three-way valves 33, 34 and 35, the flow rate of the gas mixture varies periodically. When the mixing proportions of the source gasses become inconsistent, the four-way valve 36 is closed and the three-way valve 37 is opened to supply the gas mixture to the second vent line 29a, not to the vapor deposition region 39. Subsequently, the gas mixture is exhausted through an exhaust apparatus 40.

The apparatus of the present invention includes a mechanism for switching the flow of a mixture of the source gasses passing through the run line 27 from the run line 28 connected directly to the vapor deposition region to the vent line 29a. Therefore, when the flow rates of the respective source gasses, which are gathered in and passed through the first run line 27, become consistent, the three-way valve 37 is closed, the four-way valve 36 is opened, and the flow of the source gasses passing through the run line 27 is switched from the second vent line 29a to the second run line 28 to supply the source gasses to the vapor deposition region 39. Immediately after the flow of the source gasses is switched, the flow rates of the gasses passing through the first run line 27 vary. However, since the mixing proportions of the source gasses passing through the first run line 27 have become consistent, the proportions of the gasses do not vary even when the flow rates of the gasses vary, and thus compositional proportions of elements constituting the vapor-grown mixed crystal do not vary. In addition, according to the double vent/run mechanism, the source gasses having consistent mixing proportions are supplied to the vapor deposition region 39 regardless of the positions through which the respective source gasses are fed to the first run line since the second run line is provided. Preferably, a source gas having a higher boiling point is fed to the run line 27 through a position nearer to the vapor deposition region 39.

The aforementioned vapor deposition apparatus including the double vent/run piping system can be employed, for example, for vapor-growth of a crystal layer of a group II-VI compound semiconductor such as zinc magnesium sulfide selenide ($Zn_xMg_{1-x}S_{1-y}Se_y$: 0<X, Y<1). Particularly, when hydrogen selenide ($H_2Se$) or hydrogen sulfide ($H_2S$), which has a low boiling point and assumes the gaseous state at room temperature, is employed as a source gas of a group VI element, a mixed crystal layer having desired compositional proportions can be produced since condensation of the source gas in the piping system can be prevented.

As shown in FIG. 2, the first vent line 29 is an exhaust line provided for passing source gasses that are unnecessary for vapor-growth of a crystal layer, and the first vent line 29 corresponds to the first run line 27. The second vent line 29a is a vent line provided for exhausting the source gasses that are unnecessary for vapor-growth of a crystal layer and that have been passed through the first vent line 29, and the line 29a corresponds to the second run line 28. The second run line 28 is connected directly to the vapor deposition region (reactor) 39. The second vent line 29a is detoured away from the vapor deposition region 39, and is not connected to the region 39 but is connected directly to the apparatus 40, in which exhaust of gas is carried out. The exhaust apparatus 40 includes a combustion-type or adsorption-type elimination apparatus. When the first and second vent lines 29 and 29a are connected together, pressure in the vent line 29 becomes equal to that in the vent line 29a. For example, when a three-way valve 38 is opened, differences in pressure between the first and second vent lines 29 and 29a can be eliminated. In order to equalize pressure in the first vent line 29 or the second vent line 29a with that in the first run line 27 or the second run line 28, a mechanism for feeding a carrier gas into the vent lines is preferably provided. For example, as shown in FIG. 2, the vent line 29a is provided with a carrier gas supply line 46, and the vent line 29 is provided with a carrier gas supply line 42. When the flow rate of a gas fed through the carrier gas line 46 is regulated by a gas flowmeter 48, pressure in the second run line 28 can be equalized with that in the second vent line 29a. Consequently, when the path of the source gas passing through the first run line 27 is switched from the second vent line 29a to the second run line 28, temporal variance in the flow rate of the source gas can be decreased.

As described above, a characteristic feature of the present invention resides in a mechanism in which the flow of a gas passing through the first run line 27 can be switched from the second run line 28 to the second vent line 29a. When the first run line 27 is connected to the second vent line 29a when source gasses are unnecessary or mixing proportions of the gasses are inconsistent, the source gasses can be passed through the vent line 29a without supply of the gasses to the vapor deposition region 39; i.e., without addition of the gasses to vapor deposition reaction region. Therefore, when the piping system of the present invention is employed, the source gasses having consistent mixing proportions are advantageously supplied to the vapor deposition region. Switching of the path of the source gasses passing through the first run line 27 from the second run line 28 to the second vent line 29a and vice versa is carried out by an opening and closing operation of the valves 36 and 37. When the valve 36 is closed and the valve 37 is opened, the path of the source gasses is switched from the second run line 28 to the second vent line 29a. For example, in order to switch the path of the source gasses while reducing retention of the gasses, the valve 36 provided on the second run line 28 is preferably a pneumatic-type four-way valve. Each of the valves 37 and 38 provided on the second vent line 29a is preferably a three-way valve.

In the piping system of the present invention, lines 41 and 42 for feeding carrier gasses into the first run line 27 and the first vent line 29, respectively, are provided on the upstream sides of the lines 27 and 29, respectively. Flow control apparatuses 43 and 44 for separately regulating the flow rates of the carrier gasses are provided (see FIG. 2). In the piping system, when the flow rates of the carrier gasses are regulated and then the gasses are fed into the first run line 27 and the first vent line 29, pressure in the line 27 is advantageously equalized with that in the line 29. The piping system is described with reference to FIG. 2. For example, the flow rates of the carrier gasses passing through the first run line 27 and the first vent line 29 are separately and appropriately regulated by means of the flowmeters 43 and 44, which are exclusively provided on the lines 27 and 29, respectively, and thus pressure in the line 27 is equalized with that in the line 29. By maintaining consistency in pressure in the lines 27 and 29, temporal variance in the flow rate of the source gas can be decreased when the path of the source gas is switched from the line 27 to the line 29 or vice versa. When difference in pressure between the line 27 and the line 29 is $5 \times 10^2$ Pa or less, temporal variance in the flow rate of the source gas is effectively decreased. The carrier gas is not necessarily the same as the aforementioned gas accompanied by vapor of the source. Examples of carrier gasses which may be employed include hydrogen ($H_2$), nitrogen ($N_2$), and argon (Ar).

In the piping system of the present invention, similar to the lines 41 and 42 for feeding carrier gasses into the first run line 27 and the first vent line 29, respectively, lines 45 and 46 for feeding carrier gasses into the second run line 28 and the second vent line 29a, respectively, are preferably provided on the upstream sides of the lines 28 and 29a, respectively. In addition, flow control apparatuses 47 and 48 for separately regulating the flow rates of the carrier gasses are preferably provided. As shown in FIG. 2, when the flow rates of the carrier gasses passing through the second run line 28 and the second vent line 29a are separately regulated by means of the flowmeters 47 and 48, which are exclusively provided on the lines 28 and 29a, respectively, pressure in the line 28 is equalized with that in the line 29a.

For example, when the line 27 is connected to the line 29a and the line 45 is connected to the line 28 through operation of the valves 36 and 37, temporal variance in the flow rate of the source gas is effectively reduced when switching between the lines 28 and 29a is carried out; i.e., when the line 27 is connected to the line 28 or connected to the line 29a when difference in pressure between the lines 28 and 29a is maintained at $5 \times 10^2$ Pa or less. The carrier gas is not necessarily the same as the aforementioned gas accompanied by vapor of the source or the carrier gas passing through the lines 27 and 29. Examples of carrier gasses which may be employed include hydrogen ($H_2$), nitrogen ($N_2$), and argon (Ar).

Figure 3:
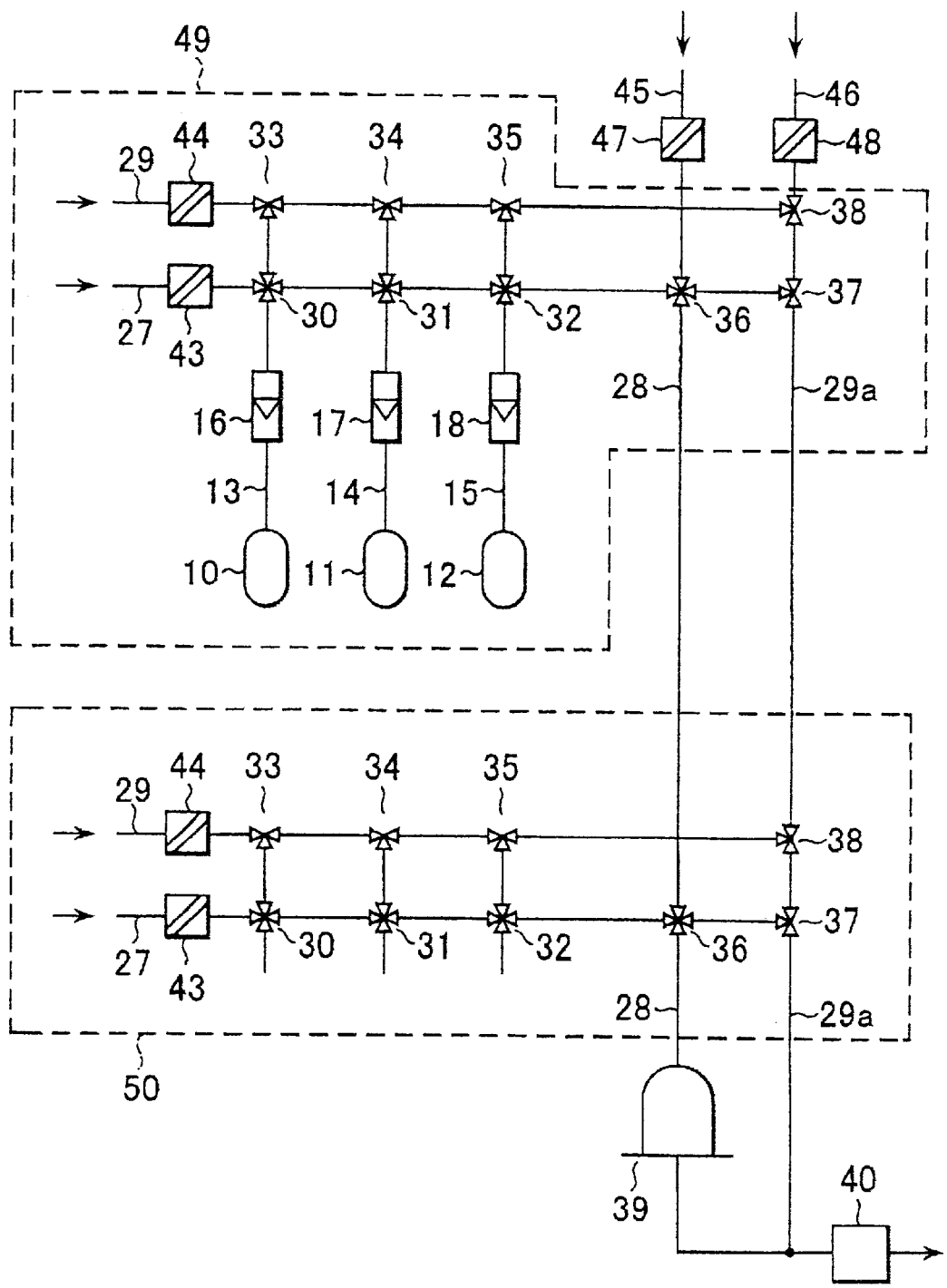
FIG. 3 shows a schematic diagram of another piping system of the present invention.

An embodiment of the present invention will be described in more detail. FIG. 3 illustrates a source supply piping system which is suitable for vapor-growth of a gallium indium phosphide ($Ga_xIn_{1-x}P$: $0 \leq X \leq 1$) crystal layer by MOCVD, particularly suitable for formation of a heterojunction interface where composition changes sharply. The interface is essential for a two-dimensional electron gas field effect transistor or highly sensitive Hall device to exhibit high electron mobility. In the piping system, in addition to a piping system 49 for supplying the group III element source, a piping system 50 for supplying the group V element source (not shown in FIG. 3), such as phosphine ($PH_3$), is provided in order to prevent polymerization attributed to association of a group V element source with a group III organic compound serving as a source of a group III element. The piping systems 49 and 50 for supplying the group III element source and the group V element source, respectively, are of vent/run-type. Since the piping systems 49 and 50 for supplying the group III element source and the group V element source, respectively, are provided separately, association reaction between the group III element source and the group V element source can be prevented. In addition, the source gasses can be supplied while reducing temporal variance in the flow rate of the respective source gasses. As a result, a crystal layer having an epitaxial heterojunction structure, in which variance in compositional proportions is small, is vapor-grown. The layer has low roughness and is flat, and there is a sharp change in composition at the heterojunction. A sharp change of composition at the heterojunction interface formed through the system can be evaluated by, for example, compositional analysis by thickness fringe method (CAT method) using a transmission electron microscope (TEM) (see Akira Sotomura ed., "DENSHI KENBIKYO GIUTSU," published on Aug. 31, 1989, by Maruzen, pp. 83–90).

The source supply piping system shown in FIG. 3 has a duplicate vent/run structure including two source supply systems shown in FIG. 2. A sharp change of composition at a heterojunction interface attained by the present invention is not impaired by the number of source supply piping systems provided. This is because, the path of a source gas can be switched instantaneously by means of the double vent/run mechanism described herein even when a plurality of source supply piping systems are provided. No particular limitation is imposed on the position of the piping system for supplying the group III element source or the group V element source with respect to the position of a vapor deposition region 39. In a group III-V compound semiconductor crystal layer produced by use of an MOCVD apparatus, an organometallic compound serving as a group III element source has a melting point and boiling point higher than those of a group V element hydride serving as a group V element source. For example, the melting point of trimethylaluminum (($CH_3)_3Al$) is about 15° C., and the melting point of arsine ($AsH_3$) is about −117° C. Therefore, in order to suppress condensation in the run lines, the line through which a source having a higher boiling point passes is preferably provided closer to the vapor deposition region. Usually, in the piping system of the vapor deposition apparatus for producing a group III-V or group II-VI compound semiconductor, the supply amount of a hydride of group V or group VI element or the concentration of the hydride does not decrease, which is attributed to condensation, and the hydride can be effectively supplied to the vapor deposition region since the boiling point of the hydride of group V or group VI element is much lower than room temperature. As a result, deterioration of the surface conditions of the compound semiconductor crystal layer, which is attributed to evaporation of the group V or group VI element, can be prevented.

Figure 4:
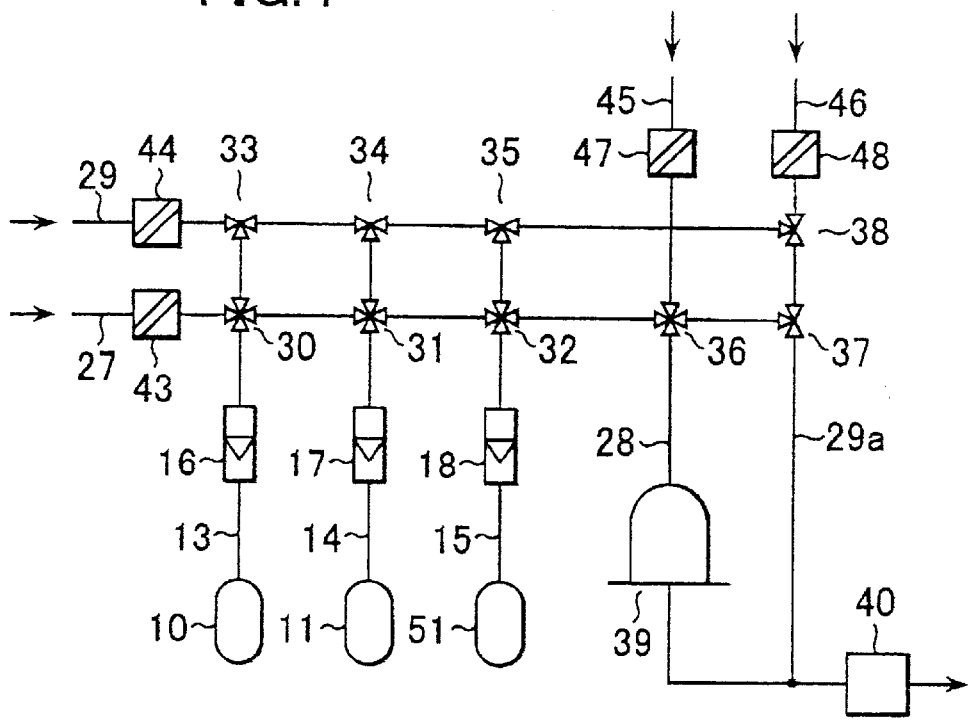
FIG. 4 shows a schematic diagram of another piping system of the present invention.

FIG. 4 is a schematic diagram showing a source supply piping system of another embodiment of the present invention. A characteristic feature of the piping system is that different sources; i.e., a group III element source and a group V element source, can be gathered and supplied to a vapor deposition region 39. For example, group III element sources 10 and 11 and a group V element source 51 can be gathered in a first run line 27 and passed therethrough in advance. Corresponding to the first run line 27, a first vent line 29 for exhausting the source gasses is provided. The first run line 27 is connected to a second run line 28 for supplying the source gasses passing therethrough to the vapor deposition region 39. The first vent line 29 is connected directly to a second vent line 29a. The piping system is suitable for vapor-growth of a semiconductor crystal layer of a group III-V compound such as gallium indium phosphide ($Ga_xIn_{1-x}As$: $0 \leq X \leq 1$) produced from arsine ($AsH_3$) serving as an arsenic (As) source, in which polymerization between the sources is relatively mild. Particularly, the piping system is suitable for vapor-growth of an epitaxial stacked layer structure employed in an aluminum indium arsenide ($Al_xIn_{1-x}As$: $0 < X \leq 1$)/$Ga_xIn_{1-x}As$ ($0 \leq X \leq 1$) TEGFET, which requires a heterojunction interface at which composition changes sharply.

Figure 5:
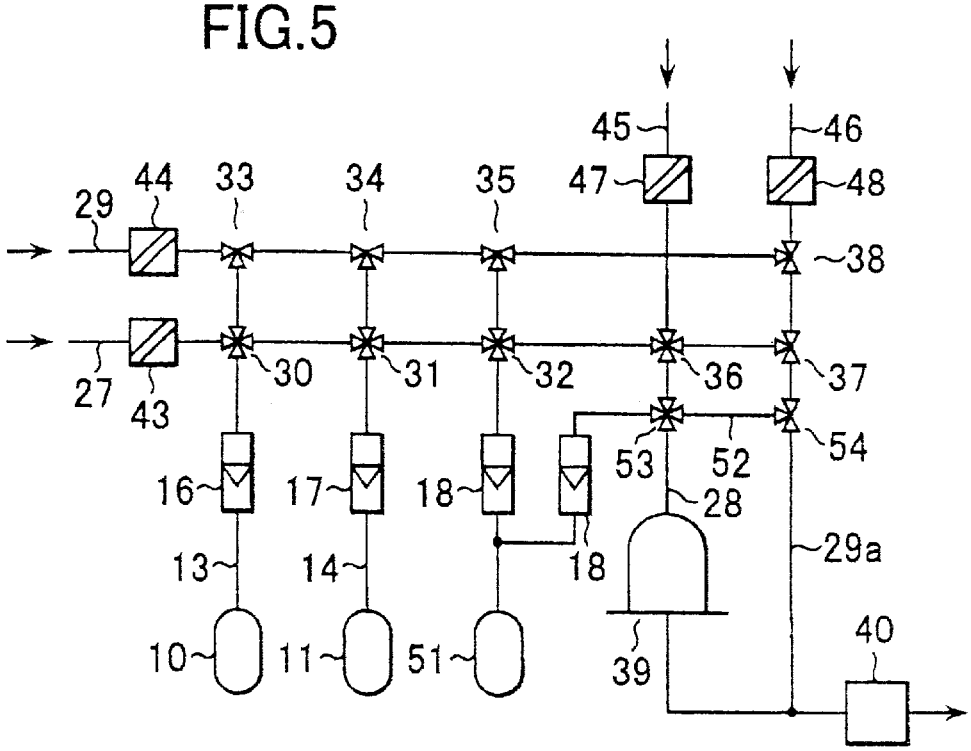
FIG. 5 shows a schematic diagram of a modification of the piping system shown in FIG. 4.

FIG. 5 illustrates a modification of the piping system shown in FIG. 4. The piping system shown in FIG. 5 is particularly suitable for vapor-growth of a compound semiconductor crystal layer containing a volatile element. For example, in the source gas piping system shown in FIG. 5, there is provided a line 52 for passing a volatile element source through a second run line 28 or a second vent line 29a in addition to the basic piping system shown in FIG. 4. Switching between the second run line 28 and the second vent line 29a is carried out by an opening and closing operation of valves 53 and 54. For example, source gasses are passed through a first run line 27 and the second run line 28 to vapor-grow a first crystal layer. Thereafter, the path of the source gasses is switched from the second run line 28 to the second vent line 29a. Subsequently, source gasses necessary for vapor-growth of a second crystal layer are gathered in the first run line 27, and then passed therethrough. In order to make the flow rates of the source gasses consistent, the gas source of volatile element is supplied to a vapor deposition region 39 via the second run line 28 by use of the line 52 while the source gasses are passed through the first run line 27. After consistency in the flow rates of the source gasses for vapor-growth of the second crystal layer is determined, the source gasses for vapor-growth of the second crystal layer are supplied to the vapor deposition region via the first and second run lines 27 and 28 while the path of the gas source of the volatile element is switched from the second run line 28 to the second vent line 29a.

Consequently, after completion of vapor-growth of the first crystal layer, evaporation of the volatile element from the surface of the first crystal layer is suppressed until the second crystal layer is vapor-grown. Because of suppression of evaporation of the volatile element, the first crystal layer exhibits good surface morphology. In addition, the second crystal layer exhibiting excellent surface morphology is vapor-grown on the first crystal layer. The piping system shown in FIG. 5 is suitably employed, for example, for vapor-growth of a gallium indium nitride ($Ga_xIn_{1-x}N$: $0 \leq X \leq 1$) crystal layer, since nitrogen (N) evaporates in a significant amount during vapor-growth at a high temperature of about 1000° C.

According to the vapor deposition apparatus and the process using the apparatus of the present invention, as described above, a semiconductor junction interface where composition changes sharply is formed. A semiconductor device exhibiting excellent electric characteristics, such as a Schottky junction-type field effect transistor (MESFET) or a heterojunction bipolar transistor (HBT), can be produced from a stacked layer structure including such a semiconductor junction interface where composition changes sharply.

An example of high-frequency semiconductor device, which can be operated at a high frequency band such as a microwave band or a millimeter wave band, is a strained-layer superlattice TEGFET including a heterojunction structure produced by a spacer layer or an electron supply layer formed from aluminum gallium arsenide ($Al_xGa_{1-x}As$: usually $0.2 \leq X \leq 0.4$) and a channel layer formed from gallium indium arsenide ($Ga_xIn_{1-x}As$: usually $0.7 \leq X \leq 0.9$). According to the vapor deposition apparatus and the process of the present invention, when a stacked layer structure employed in this pseudomorphic TEGFET is formed, the compositional proportions of aluminum (Al) and indium (In) can change sharply at a heterojunction structure. Therefore, composition changes sharply at the $Al_xGa_{1-x}As/Ga_xIn_{1-x}As$ heterojunction interface, and bending of electron beam interference fringe is not observed on the CAT image of the heterojunction interface. The sharp change of composition at the heterojunction interface between the electron supply layer or the spacer layer and the channel layer causes localization of low-dimensional electrons in the vicinity of the interface and high electron mobility.

Improvement of electron mobility is apparent in a stacked layer structure including a lattice-matching heterojunction structure between aluminum gallium arsenide and gallium arsenide produced by the process of the present invention, when the stacked layer structure is employed in a TEGFET. For example, the electron mobility of a conventional stacked layer containing sheet carriers in an amount of about $1.2 \times 10^{12}$ cm$^{-3}$ is about 70,000–100,000 cm$^2$/V·s at 77 K (temperature of liquid nitrogen), and the mobility of two-dimensional electrons of the stacked layer of the present invention containing sheet carriers in an amount of about $1.2 \times 10^{12}$ cm$^{-3}$ is consistently in excess of about 100,000 cm$^2$/V·s at 77 K. A strained-layer superlattice-type or lattice-matching-type stacked layer structure, including a heterojunction interface between a spacer layer and a channel layer where composition changes sharply, and with excellent electron mobility, is advantageously employed for producing a low-noise field effect transistor exhibiting excellent transconductance (gm) and having a low noise figure (see Seijiro Furukawa et al., "DENSHI DEBAISU KOGAKU, "8th printing of 1st edition, published on Oct. 16, 1995, by Morikita Shuppan pp. 75–77).

A low-noise TEGFET of excellent noise figure (NF), which is produced from an $Al_xGa_{1-x}As/GaAs$ lattice-matching, $Al_xIn_{1-x}As/Ga_xIn_{1-x}As$ lattice-matching, or $Al_xGa_{1-x}As/Ga_xIn_{1-x}As$ stacked layer structure for producing an FET including a heterojunction interface where composition changes sharply, and the interface formed consistently by the vapor deposition process using the vapor deposition apparatus of the present invention, is effectively employed for producing, for example, an L-band (customarily 1.0–2.6 GHz) low-noise amplifier, a 12 GHz or 18 GHz low-noise amplifier, a 45 GHz millimeter wave low-noise amplifier, or a communication apparatus for 100 GHz base-broadcasting millimeter wave transmission. A low-noise or low-power TEGFET, which is produced from a $Ga_xIn_{1-x}P/Ga_xIn_{1-x}As$ stacked layer structure having two-dimensional electron gas, a heterojunction interface of the structure formed by the process of the present invention, and which is characterized in that composition changes sharply at the interface, the electron mobility of the structure is in excess of 6,000 cm$^2$/V·s at room temperature, in excess of 30,000 cm$^2$/V·s at 77 K (temperature of liquid nitrogen), and in excess of 150,000 cm$^2$/V·s at 1.6 K (see The Tenth International Conference on Metalorganic Vapor Phase Epitaxy (ICMOVPE-X) (Jun. 5–9, 2000), Workbook We-P20, p. 236), is effectively employed for producing, for example, an L-band high-frequency low-noise amplifier or a microwave or millimeter wave high-frequency transmission device.

A Hall device exhibiting high product-sensitivity can be produced from a stacked layer structure having a heterojunction interface formed by the vapor deposition process using the vapor deposition apparatus of the present invention, composition changing sharply at the interface and the electron mobility of the structure being high. For example, when a Hall device including a lattice-matching single heterojunction between indium phosphide (InP) and gallium indium arsenide ($Ga_{0.47}In_{0.53}As$) (see J. Electron. Mater., Vol. 25, No. 3 (1996), pp. 407–409) is produced by the vapor deposition process using the vapor deposition apparatus of the present invention, the compositional proportions of gallium (Ga), arsenic (As), and phosphorous (P) change sharply at the heterojunction, and thus the electron mobility of the element becomes consistently high (i.e., in excess of 9,000 cm$^2$/V·s at room temperature). Particularly, a heterojunction structure consistently exhibiting high electron mobility is advantageously produced by MOCVD, which is suitable for vapor-growth of a group III-V compound semiconductor layer containing phosphorous as an element compared with halogen VPE or molecular beam epitaxy (MBE), by means of the vapor deposition process using the vapor deposition apparatus of the present invention (see Extended Abstracts (The 53rd Autumn Meeting, 1992); The Japan Society of Applied Physics No. 1, published on Sep. 16, 1992, by Oyobutsurigakkai, 18a-ZE-3, pp. 283). Since a heterojunction structure exhibiting high electron mobility is consistently produced, a $Ga_{0.47}In_{0.53}As/InP$ heterojunction Hall device exhibiting high product-sensitivity (i.e., in excess of 800 V/A T) (see the above J. Electron. Mater., Vol. 25, (1996)) is advantageously produced.

A heterojunction interface where composition changes sharply, which is consistently formed by the vapor deposition process using the vapor deposition apparatus of the present invention, promotes localization of carriers in the vicinity of the interface. A Hall device exhibiting high mobility of localized electrons (two-dimensional electrons), such as a two-dimensional electron Hall device produced from an $Al_xGa_{1-x}As/GaAs$ or $Ga_xIn_{1-x}As/InP$ lattice-matching stacked layer structure, is employed for producing a sensor in which the Hall device is employed as a magneto-electric device, such as a magnetic field strength meter, an earth magnetism meter, a rotation meter, or a range finder (see IEEE Trans. Electron Dev., ED-41 (3) (1994), pp. 315). Particularly, a Hall device having a heterojunction interface where composition changes sharply, such as a $Ga_{0.47}In_{0.53}As/InP$ two-dimensional electron Hall device, provides large Hall voltage in relation to unit operation current and unit magnetic field strength; i.e., the product-sensitivity of the element is enhanced (see the above J. Electron. Mater., Vol. 25 (1996), pp. 407–409; and Extended Abstracts (The 53rd Autumn Meeting, 1992)) compared with a conventional value of 760 V/A T (see the above IEEE Trans. Electron Dev., ED-41 (3)). Thus, when the Hall device is employed in a measurement apparatus, a measurement apparatus of high sensitivity can be produced.

According to the vapor deposition apparatus and the process using the apparatus of the present invention, a multi-heterojunction structure containing a heterojunction interface where composition changes sharply is formed. For example, a single or double heterojunction structure, a strained-layer super-lattice structure, or a single- or multi-quantum well structure of gallium nitride (GaN) and gallium indium nitride ($Ga_xIn_{1-x}N$: $0<X<1$), where the compositional proportion of indium (In) changes sharply at the heterojunction interface, is produced. In a gallium indium nitride light-emitting diode (LED) or laser diode (LD) including a light-emitting portion formed from a $Ga_xIn_{1-x}N/GaN$ heterojunction structure, sharp change of composition at the heterojunction interface is an important factor affecting the monochromaticity of emission (see Japanese Patent Application Laid-Open (kokai) No. 10-168241). In a quantum well structure, monochromatic emission is obtained when the compositional proportion of indium (In) changes sharply and consistently at the heterojunction interface between a well layer and a barrier layer. According to the vapor deposition apparatus and the process using the apparatus of the present invention, a single-quantum well (SQW) or multi-quantum well (MQW) structure containing a heterojunction interface where composition changes sharply is consistently produced. Therefore, by employing such a structure, a gallium indium nitride blue LED or blue LD exhibiting excellent monochromaticity is advantageously produced.

EXAMPLES

The present invention will be described in more detail by way of Examples, which are not intended to limit the scope of the present invention, and should not be construed as limiting the present invention. Unless indicated otherwise herein, all parts, percents, ratios and the like are by weight.

Example 1

The present invention will be described in more detail by taking, as an example, a vapor deposition apparatus for forming an epitaxial stacked layer structure employed in a gallium indium phosphide $(Ga_{0.51}In_{0.49}P)/Ga_{0.80}In_{0.20}As$ heterojunction high-electron-mobility field effect transistor.

Figure 6:
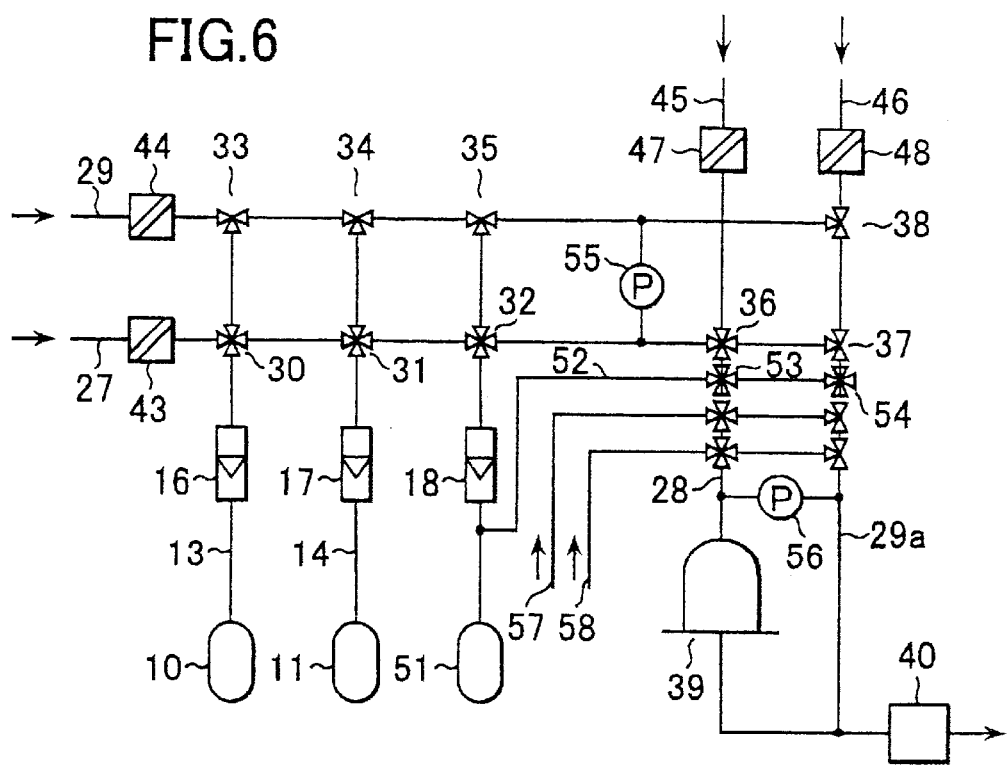
FIG. 6 shows a schematic diagram of the vapor deposition apparatus including the piping system described in Example 1.

FIG. 6 is a schematic diagram showing the piping system of the Example. The piping system is produced on the basis of a dual allign vent/run mechanism. Trimethylgallium $((CH_3)_3Ga)$ serving as a gallium (Ga) source 10 and trimethylindium $((CH_3)_3In)$ serving as an indium (In) source 11 are supplied to a first run line 27. Each of the group III element sources 10 and 11 is provided with a line for supplying hydrogen carrier gas accompanying the vapor of the source. If necessary, hydrogen gas accompanying the vapor of the source 10 or 11 is passed through the first run line 27 or a first vent line 29. The first vent line 29 is connected to a second vent line 29a via a three-way valve 38.

In addition to the group III element sources, arsine ($AsH_3$) serving as an arsenic (As) source 51 can be supplied to the first run line 27. The line for supplying arsine is branched (to a line 52), and the flow of arsine is switched between a second run line 28 and the second vent line 29a by an opening and closing operation of pneumatic-type valves 53 and 54. Compressed gas is fed to the valves 53 and 54 through an electromagnetic valve to thereby effect opening and closing of the valves 53 and 54. The source gasses passing through the first run line 27 are passed through the second run line 28 or the second vent line 29a by switching of valves 36 and 37. The second run line 28 is connected to a vapor deposition region 39. On the downstream side of the second vent line 29a, an exhaust apparatus 40 for exhausting the source gasses is provided.

On the upstream sides of the first run line 27, the first vent line 29, the second run line 28, and the second vent line 29a, carrier gas lines and electronic mass flow controllers (MFC) 43, 44, 47, and 48 are provided in order to maintain pressure in each respective line at a consistent value. The flow rate of the source gas passing through the second run line 28 to the vapor deposition region 39 is usually higher than that of the source gas passing through the first run line 27. In order to eliminate differences in pressure between the lines 27 and 29 and between the lines 28 and 29a, and to decrease variance in the flow rate of the source gas, which is due to difference in pressure between the lines 27 and 29 or between the lines 28 and 29a during switching of the path of the source gas, a differential pressure gauge 55 is provided for measuring differences in pressure between the first run line 27 and the first vent line 29. Similarly, a differential pressure gauge 56 is provided between the second run line 28 and the. second vent line 29a.

Operation of the piping system will be described in detail by taking, as an example, a case of vapor-growth of an epitaxial stacked layer structure by use of an MOCVD apparatus including the aforementioned piping system, the stacked layer structure being employed in a $Ga_{0.51}In_{0.49}P/Ga_{0.80}In_{0.20}As$ two-dimensional electron gas field effect transistor. Firstly, in order to approximately equalize pressure in the first run line 27 to that in the first vent line 29, hydrogen gas is passed through the respective lines 27 and 29 while the flow rate of the hydrogen gas is controlled at about 3–5 liter/minute by the MFCs 43 and 44. Similarly, in order to eliminate differences in pressure between the second run line 28 and the second vent line 29a, hydrogen gas is passed through the respective lines 28 and 29a at about 5–20 liter/minute in advance, while the flow rates of the hydrogen gas passing through the lines are controlled independently. Differences in pressure between the lines 27 and 29 and differences in pressure between the lines 28 and 29a are regulated by use of the differential pressure gauges 55 and 56, respectively, to about $5\times10^2$ Pa or less, preferably about $2\times10^2$ Pa or less. Under these conditions, while arsine is supplied through the line 52 to the surface of a {100}2° off gallium arsenide (GaAs) single-crystal substrate 59 placed in the vapor deposition region 39 in a vapor deposition furnace, the temperature of the GaAs single-crystal substrate 59 is elevated to an epitaxial growth temperature of about 600–700° C.

Subsequently, while the temperature of the substrate 59 is maintained temporarily at the epitaxial growth temperature, a gallium source (trimethylgallium), which is necessary for vapor-growth of a highly-resistive buffer layer 60 formed from undoped GaAs, accompanied by hydrogen gas is passed through the first vent line 29. The arsenic source (arsine) 51, the flow rate thereof having been regulated at a predetermined level by the MFC, is passed through the first vent line 29 in advance. After the temperature of the substrate 59 and the flow rates of the gallium source and the arsenic source become consistent, three-way valves 33 and 34 provided on the first vent line 29 are closed, and simultaneously, four-way valves 30 and 31 provided on the first run line 27 are opened to switch the paths of the-source gasses from the line 29 to the line 27. Through this procedure, the gallium and arsenic sources are passed through the second vent line 29a via the line 27. Subsequently, the three-way valve 37 provided on the second vent line 29a is closed, and simultaneously, the four-way valve 36 provided on the second run line 28 is opened to switch the paths of the source gasses and initiate vapor-growth of the GaAs buffer layer 60. The source gasses are supplied to the vapor deposition region until the buffer layer is vapor-grown to attain. a predetermined thickness. Thereafter, the paths of the source gasses are switched from the second run line 28 to the second vent line 29a by opening the valve 37 and closing the valve 36 to complete vapor-growth of the GaAs buffer layer 60.

Even after completion of vapor-growth of the GaAs buffer layer 60, in order to prevent evaporation of arsenic gas from the surface of the GaAs buffer layer 60, the arsine gas is continuously supplied through the line 52 to the vapor deposition region to maintain the surface of the GaAs buffer layer 60 in good condition. While the arsine gas is continuously supplied, in order to vapor-grow a $Ga_{0.80}In_{0.20}As$ electron channel layer (channel layer) 61, hydrogen gas for accompanying trimethylindium vapor, which has been constantly passed through the first vent line 27, is passed through the first run line 27 by closing the three-way valve 34 provided exclusively on the line for the indium source 11 and simultaneously opening the four-way valve 31. In addition, the flow rate of the gallium source gas, which has been passed through the first run line 27, is regulated to attain a gallium compositional proportion of 0.80. A mixture of the source gasses, for which the flow rates have been regulated to attain predetermined compositional proportions, is passed through the second vent line 29a via the first run line 27. After the flow rate of the gas mixture becomes consistent, the three-way valve 37 is closed and the four-way valve 36 is opened to switch the path of the gas mixture from the line 29a to the second run line 28 and then initiate vapor-growth of the $Ga_{0.80}In_{0.20}As$ channel layer 61. When the undoped channel layer 61 attains a thickness on the order of ten nanometers (nm), the path of the source gas is switched from the second run line 28 to the second vent line 29a to complete vapor-growth of the channel layer. Even after completion of vapor-growth of the channel layer 61, the arsine gas is continuously supplied through the line 52 to the vapor deposition region to prevent deterioration of the surface condition of the channel layer 61, which is due to evaporation of arsenic gas.

While the arsenic source is passed through the line 52, the flow rates of the gallium source 10 and the indium source 11 passing through the first run line 27 are regulated by the MFC to attain vapor-growth of an n-type $Ga_{0.51}In_{0.49}P$ layer having a gallium compositional proportion of 0.51. The mixed source gasses are passed through the second vent line 29a via the first run line 27. Subsequently, supply of the arsenic source (arsine) through the line 52 to the vapor deposition region 39 is stopped. Simultaneously or several seconds after termination of supply of the arsenic source, phosphine ($PH_3$) serving as a phosphorous (P) source (not shown in FIG. 6) is supplied to the vapor deposition region 39 through another line 57. After the phosphorous source is passed through the line 57 until the flow rate thereof becomes consistent at a predetermined level, the paths of the source gasses are switched from the second vent line 29a to the second run line 28 to vapor-grow the n-type $Ga_{0.51}In_{0.49}P$ layer as an electron supply layer 62. When the n-type $Ga_{0.51}In_{0.49}P$ electron supply layer is formed, a doping source such as silicon (Si) (not shown in FIG. 6) is supplied through an exclusive line 58. Usually, the flow rate of an n-type doping gas is determined such that the amount of carriers in the electron supply layer 62 becomes about $1\times10^{18}$–$3\times10^{18}$ cm$^{-3}$ in the vicinity of room temperature. The paths of the source gasses are switched from the second vent line 29a to the second run line 28 to vapor-grow the electron supply layer 62 having a thickness of about 20–30 nm. After completion of vapor-growth of the layer, the phosphorous source is continuously supplied to the vapor deposition region to suppress evaporation of phosphorous gas from the surface of the $Ga_{0.51}In_{0.49}P$ electron supply layer 62 and to maintain the surface thereof in good condition.

Figure 7:
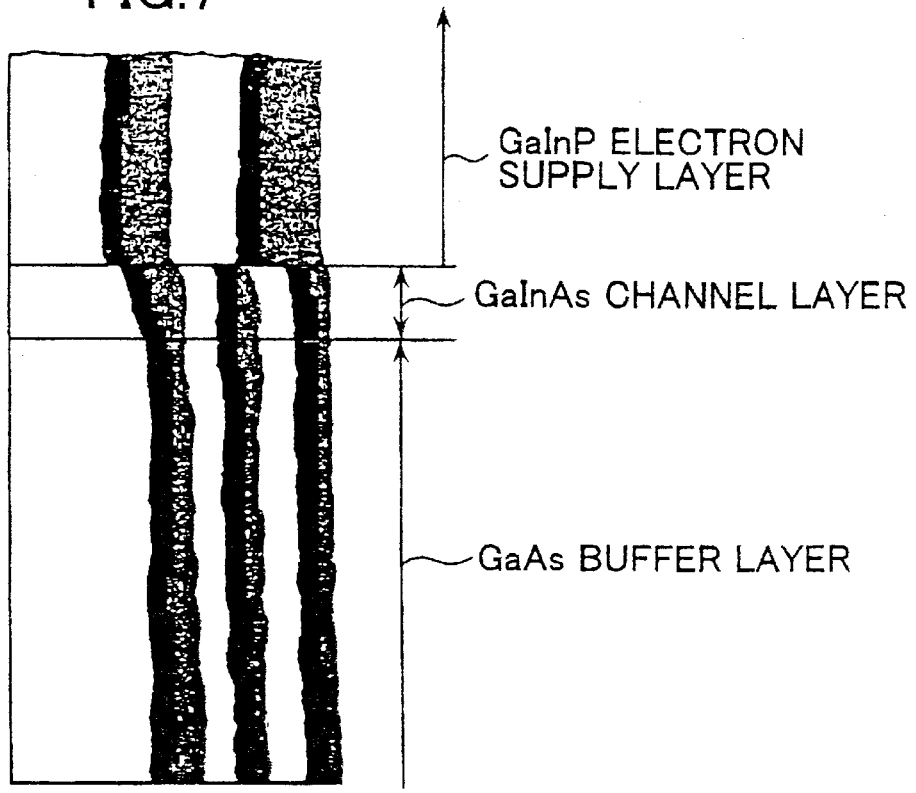
FIG. 7 shows a CAT image of the stacked layer structure which is vapor-grown by the process described in Example 1.

When a highly-resistive undoped $Ga_{0.51}In_{0.49}P$ for Schottky gate formation or an n-type GaAs cap layer is further vapor-grown on the n-type $Ga_{0.51}In_{0.49}P$ electron supply layer 62, the aforementioned path switching procedure is carried out. That is, source gasses necessary for forming a desired crystal layer are temporarily gathered in the first run line 27, the paths of the source gasses are switched between the second run line and the second vent line, and then the source gasses are supplied to the vapor deposition region to carry out vapor-growth of the crystal layer. FIG. 7 is a schematic representation of a CAT (compositional analysis by thickness fringe) image of a heterojunction interface 64 between the channel layer 61 and the electron supply layer 62. The composition changes sharply at the interface of the $Ga_{0.51}In_{0.49}P/Ga_{0.80}In_{0.20}As$ heterojunction-type stacked layer structure for TEGFET, and the structure is formed by the process of the present invention. As shown in FIG. 7, when the vapor deposition apparatus of the present invention including the dual vent/run piping system is employed, a heterojunction structure containing an interface where composition changes sharply is produced.

Figure 8:
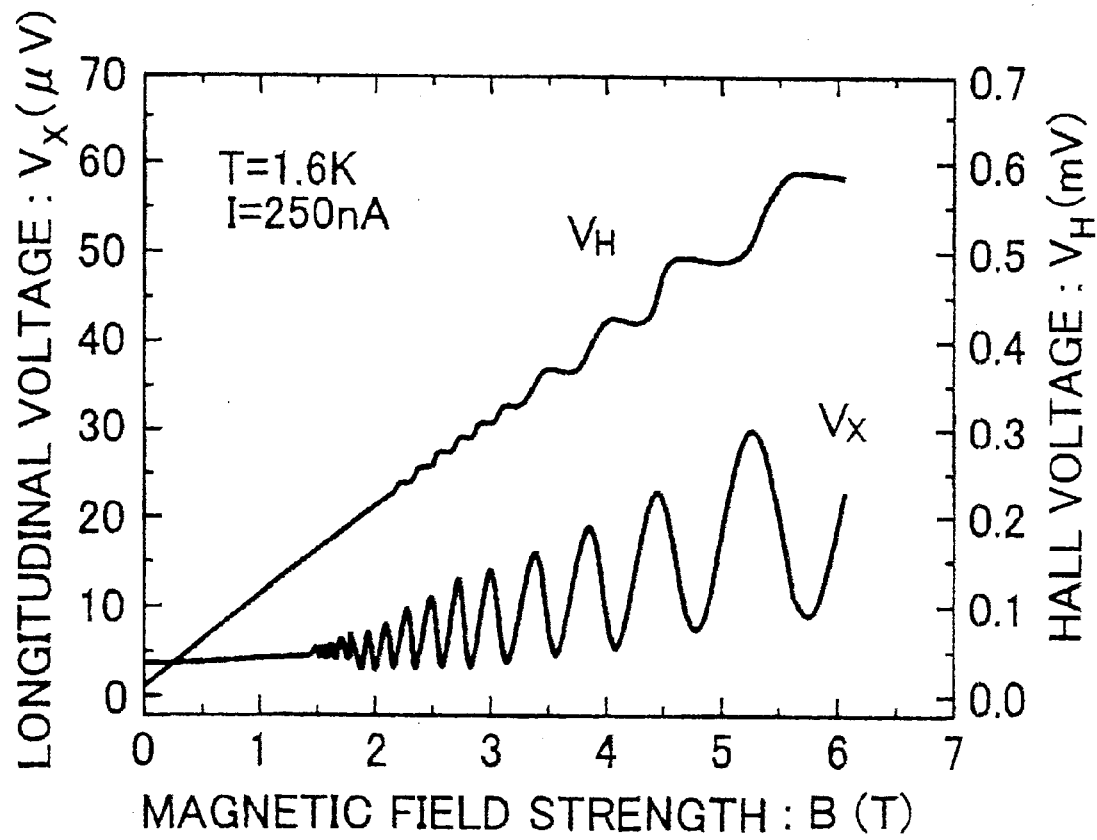
FIG. 8 shows dependence of Hall resistance of the stacked layer structure, which is vapor-grown by the process described in the Comparative Example, on magnetic field strength.

As shown in FIG. 8, in the $Ga_{0.51}In_{0.49}P/Ga_{0.80}In_{0.20}As$ heterojunction-type structure containing an interface where composition changes sharply, Shubnikov-de Haas (SdH) oscillation with respect to Hall voltage is observed. The stacked layer structure for TEGFET formed through the process described in the Example has an electron mobility ($\mu$) as high as about 6,300 cm$^2$/V·s at room temperature when the sheet carrier concentration ($n_S$) is about $1.4\times10^{12}$ cm$^{-2}$. At 77 K, the stacked layer structure has an electron mobility ($\mu$) as high as 31,600 cm$^2$/V·s when the sheet carrier concentration ($n_S$) is about $1.4 \times 10^{12}$ cm$^{-2}$. At 1.6 K, the stacked layer structure has an electron mobility ($\mu$) as high as about 200,000 cm$^2$/V·s. Therefore, when the vapor deposition apparatus including the piping system of the present invention is employed, a two-dimensional electron gas heterojunction epitaxial structure containing an interface at which composition changes sharply is vapor-grown.

Comparative Example

Figure 1:
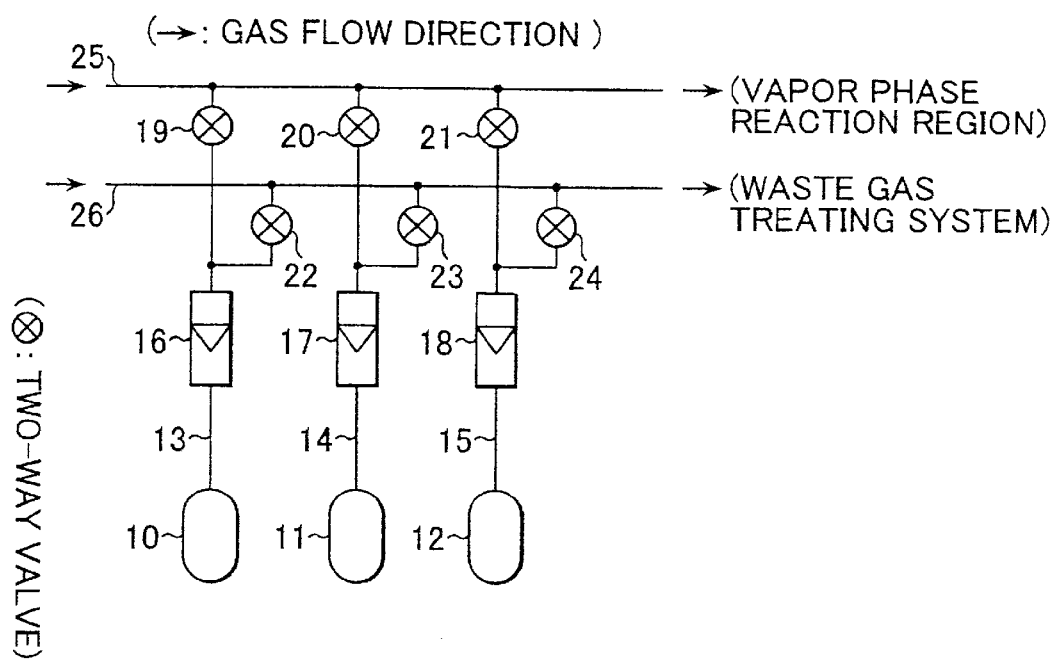
FIG. 1 shows a schematic diagram of a conventional single vent/run-type piping system. In the piping system, valves 19 and 22 are not opened simultaneously; and neither are valves 20 and 23 or valves 21 and 24.
Figure 9:
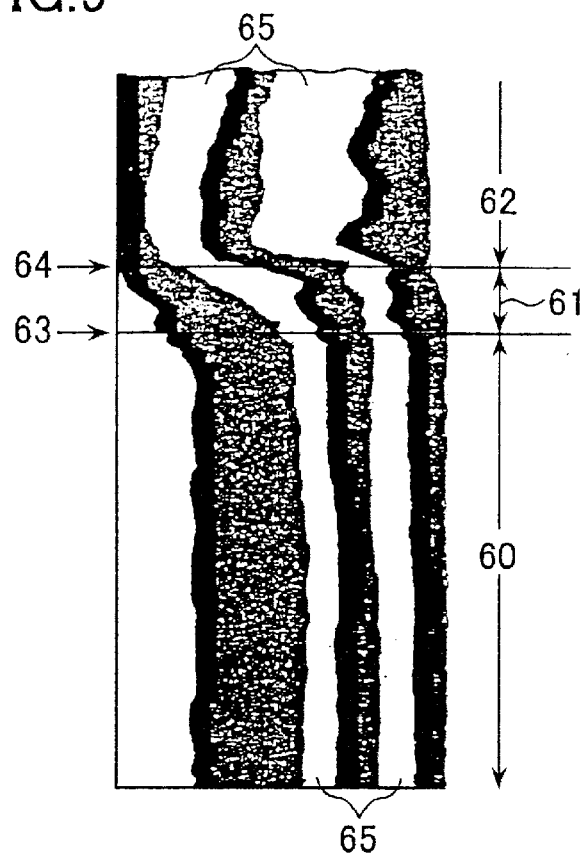
FIG. 9 shows a CAT image of the stacked layer structure that is vapor-grown by the process described in the Comparative Example.

A $Ga_{0.51}In_{0.49}P/Ga_{0.80}In_{0.20}As$ stacked layer structure for a field effect transistor was formed using an MOCVD apparatus including the conventional single vent/run piping system shown in FIG. 1 under the same flow rate conditions as described in Example 1. FIG. 9 is a schematic representation of a CAT image of the stacked layer structure produced by the process using the conventional path switching means.

In the conventional vent/run piping system of the Comparative Example for passing source gasses, unlike the case of Example 1, the source gasses are not gathered and supplied to the vapor deposition region individually. Briefly, a source gas necessary for vapor-growth of a crystal layer must be supplied to the run line when necessary. Therefore, for example, when vapor-growth of a $Ga_{0.80}In_{0.20}As$ channel layer is initiated after completion of vapor-growth of a GaAs buffer layer, an indium source must be additionally passed through the run line. Unlike the flow rates of gallium and arsenic sources passed through the run line, the flow rate of the indium source temporarily varies. Even when the path of the indium source passed through the vent line at a predetermined flow rate is instantaneously switched to the run line, completely preventing periodical variance in the flow rate due to switching of the line is very difficult. Furthermore, since the run line is connected directly to the vapor deposition region, temporal variance in the flow rate of the indium source causes inconsistency in the mixing ratio of the indium source and the gallium source in the vapor deposition region. Occurrence of bending on electron-beam interference fringes 65 in the vicinity of a heterojunction interface 63 between a GaAs buffer layer 60 and a $Ga_{0.80}In_{0.20}As$ channel layer 61 and in the region of the layer 61, as shown in a CAT image in FIG. 9, reveals that inconsistency in the mixing ratio of the source gasses causes variance in composition of the resultant mixed crystal layer.

When a $Ga_{0.51}In_{0.49}P$ electron supply layer is vapor-grown on the $Ga_{0.80}In_{0.20}As$ channel layer by using the conventional piping system, the flow rates of the source gasses also vary temporarily. In the case of vapor-growth of the electron supply layer, in order to form a $Ga_{0.51}In_{0.49}P$ layer having a gallium compositional proportion of 0.51, the gallium source and the indium source mixed at a predetermined ratio must be passed simultaneously through the run line connected directly to the vapor deposition region. Briefly, the source gasses consisting of a plurality of elements must be fed simultaneously to the run line. When both the group III elements are fed simultaneously to a single run line, the flow rates of both the source gasses vary greatly. Therefore, at the heterojunction interface between the $Ga_{0.80}In_{0.20}As$ channel layer and the $Ga_{0.51}In_{0.49}P$ electron supply layer, composition does not change sharply. The CAT image of FIG. 9 shows that the composition dose not change sharply at the heterojunction interface 64 between the channel layer 61 and the electron supply layer 62 compared with the heterojunction interface 63 between the buffer layer 60 and the channel layer 61.

Figure 10:
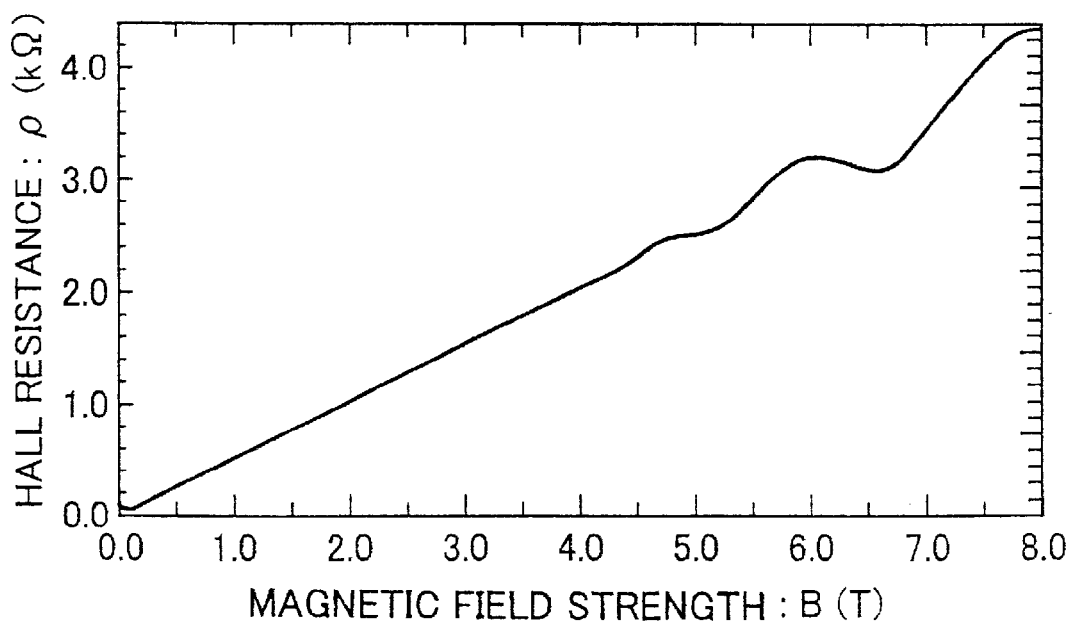
FIG. 10 shows dependence of Hall resistance of the stacked layer structure, which is vapor-grown by the process described in the Comparative Example, on magnetic field strength.

As shown in FIG. 10, in the $Ga_{0.51}In_{0.20}As/Ga_{0.51}In_{0.49}P$ heterojunction interface structure containing an interface where composition dose not change sharply, oscillation of Hall resistance representing the presenting of two-dimensional electrin gas is not clearly observed from measurement of quantum Hall effect. Thereforae, the average electron mobility of the structure is as low as about 4,000–5,000 cm$^2$/V·s at room temperature when $n_s$ is about $1.4 \times 10^{12}$ cm$^{-2}$. That is, a stacked layer structure of high electron mobility containing a heterojunction interface where composition changes sharply, which can be produced by means of the vapor deposition apparatus of the present invention, cannot be produced by means of the vapor deposition apparatus having the conventional piping system.

Example 2

The present invention will be described in more detail by taking, as an example, production of a high-electorn-mobility field effect transistor from a gallium phosphide $(Ga_{0.51}In_{0.49}P)/Ga_{0.80}In_{0.20}As$ heterojunction stacked layer structure formed by means of the vapor deposition of the present invention.

Figure 11:
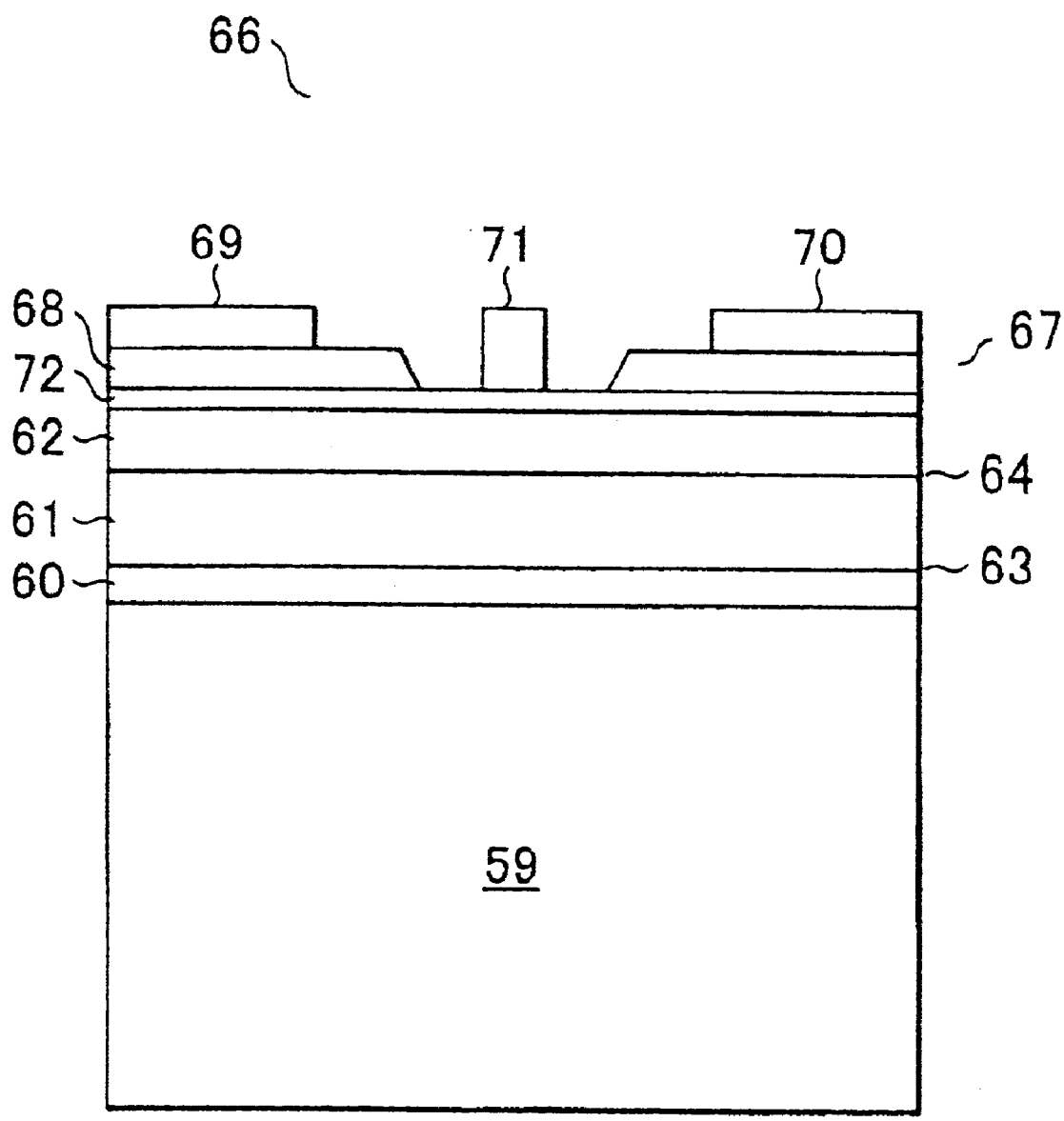
FIG. 11 shows a schematic cross-sectional view of a two-dimensional electron gas field effect transistor (TEGFET).

FIG. 11 is a schematic representation showing a cross-sectional view of the structure of a two-dimensional electron gas field effect transistor (TEGFET) 66 of the Example. Elements identical with those descrideb in Example 1are identified by the same reference numerals in FIG. 11, and repeated description of the elements is omitted.

A stacked layer structure 67 for producing the TEGFET 66 was formed according to the procedure descrideb in Example 1. In Example 2, a channel layer 61 was an undoped n-type $Ga_{0.80}In_{0.20}As$ growth layer containing carriers in an amount of $5 \times 10^{15}$ cm$^{-3}$ or less and having a thickness of 10 nm. An electron supply layer 62 was a Si-doped n-type $Ga_{0.51}In_{0.49}P$ growth layer containing carriers in an amount of $5 \times 10^{18}$ cm$^{-3}$ and having a thickness of 15 nm. On the $Ga_{0.51}In_{0.49}P$ electron supply layer 62 an undoped $Ga_{0.51}In_{0.49}P$ growth layer containing carriers in an amount of $2 \times 10^{16}$ cm$^{-3}$ and having a thickness of 10 nm, serving as a gate contact layer 72 was formed. On the layer 72 an Si-doped GaAs growth layer containing carriers in an amount of $3 \times 10^{18}$ cm$^{-3}$ and having a thickness of 40 nm, serving as an ohmic contact layer 68 was formed.

In order to reliably change composition sharply at the heterojunction interface between the $Ga_{0.80}In_{0.20}As$ channel layer 61 and the $Ga_{0.51}In_{0.49}P$ electron supply layer 62, after completion of vapor-growth of the channel layer 61 and before initiation of vapor-growth of the electron supply layer 62, differences in pressure between the run line 29 was eliminated (see FIG. 6). specifically, differences in pressure between the first run line 27 and the first vent line 29, as measured by the differential pressure gauge 55, was regulated to $1 \times 10^2$ Pa. Similarly, differences in pressure between the second run line 28 and the second vent line 29a, as measured by the differential pressure gauge 56, was regulated to $1 \times 10^2$ Pa. Pressure in the firs vent line 29 was equalized to that in the second vent line 29a by opening the three-way valve 38 and bringing the lines 29 and 29a in connection. Since pressure in the line 29 was equal to that in the line 29a and differences in pressure between the lines 29 and 27 was equal to the differences in pressure between the lines 29a and 28 as described above, pressure in the line 27 was equal to that in the line 28.

When the $Ga_{0.51}In_{0.49}P$ electron supply layer 62 was grown, the gallium source 10 and the indium source 11 were passed because satisfactory consistent such that a $Ga_{0.51}In_{0.49}P$ growth layer having an indium compositional proportion of 0.49 was formed. Consistency in the flow rates of the gallium source 10 and the indium source 11 was determined by disappearance of variance in the flow rates the of measured using the flowmeters 16 and 17. Specifically, the gallium source 10 and the indium source 11 were passed through the first run line 27 for five seconds until the flow rates of the source became consistent. Subsequently, the three-way valve 37 was closed, and simultaneously, the four-way valve 36 was opened, and the paths of the source gasses which had been mixed in the first run line 27 were switched from the second vent line 29a to the second run line 28 to initiate vapor-growth of the $Ga_{0.51}In_{0.49}P$ electron supply layer 62.

After completion of formation of the stacked layer structure 67, the structure was subjected to customary Hall effect measurement. The electron mobility of the structure was 6,300 $cm^2/V \cdot s$ at room temperature (sheet carrier amount =$1.3 \times 10^{12}$ $cm^{-2}$), and was as high as 35,000 $cm^2/V \cdot s$ at 77 K (temperature of liquid nitrogen). According to the CAT method, gradual bending was not observed on interference fringes at the heterojunction interface between the $Ga_{0.80}In_{0.20}As$ channel layer 61 and the $Ga_{0.51}In_{0.49}P$ electron supply layer 62; i.e., formation of the interface at which composition changes sharply was shown, and the interface satisfactorily provided high two-dimensional electron mobility.

On the ohmic contact layer 68, which was the outermost layer, a source electrode 69 and a drain electrode 70 were formed through a conventionally known process such as vacuum deposition or photolithography. The ohmic m: electrodes 69 and 70 were formed of a three-layer structure consisting of an Au Ge layer/an Ni layer/an Au layer (the outermost layer). Each of the source electrode 69 and the drain electrode 70 had a rectangular shape (length: 130 μm, width: 450 μm). Subsequently, in order to form a gate electrode 71 between the source electrode 69 and the drain electrode 70, a portion (length: about 5 μm) of the GaAs contact layer 68 was selectively removed by means of selective patterning and wet-etching according to known photolithography. Thereafter, the surface portion (about 2 nm) of the $Ga_{0.51}In_{0.49}P$ gate contact layer 72, which was exposed to the region at which the GaAs contact layer 68 was removed, was removed by use of an aqueous solution of hydrochloric acid (HCl) to form a recess structure. Subsequently, the region on which the gate electrode 71 was to be formed was subjected to selective patterning by means of conventional electron-beam photolithography. Then, the region of the gate contact layer 72 was subjected to vapor deposition by means of electron beam vapor deposition or similar means from titanium (Ti), molybdenum (Mo), and gold (Au), successively. Thereafter, the resultant layers were subjected to a known lift-off technique to form the Schottky gate electrode 71 of a three-layer Ti/Mo/Au structure having a gate length of about 0.25 μm.

When a drain voltage ($V_{ds}$) of 2 V was applied between the source electrode 69 and the drain electrode 70, the saturated drain current ($I_{dss}$) and gate pinch-off voltage of the TEGFET 66 were about 70 mA and about −0.8 V, respectively. The transconductance ($g_m$) of the TEGFET was about 250 mS/mm corresponding to the obtained high electron mobility. As a result, a GaInP TEGFET suitably employed as a low-noise field effect transistor being operated from L band to the millimeter wave band was produced.

Example 3

The present invention will be described in more detail by taking, as an example, a vapor deposition apparatus for forming an epitaxial stacked layer structure employed in an aluminum indium arsenide ($Al_{0.48}In_{0.52}As$)/$Ga_{0.47}In_{0.53}As$ lattice-matching high-electron-mobility field effect transistor.

Figure 12:
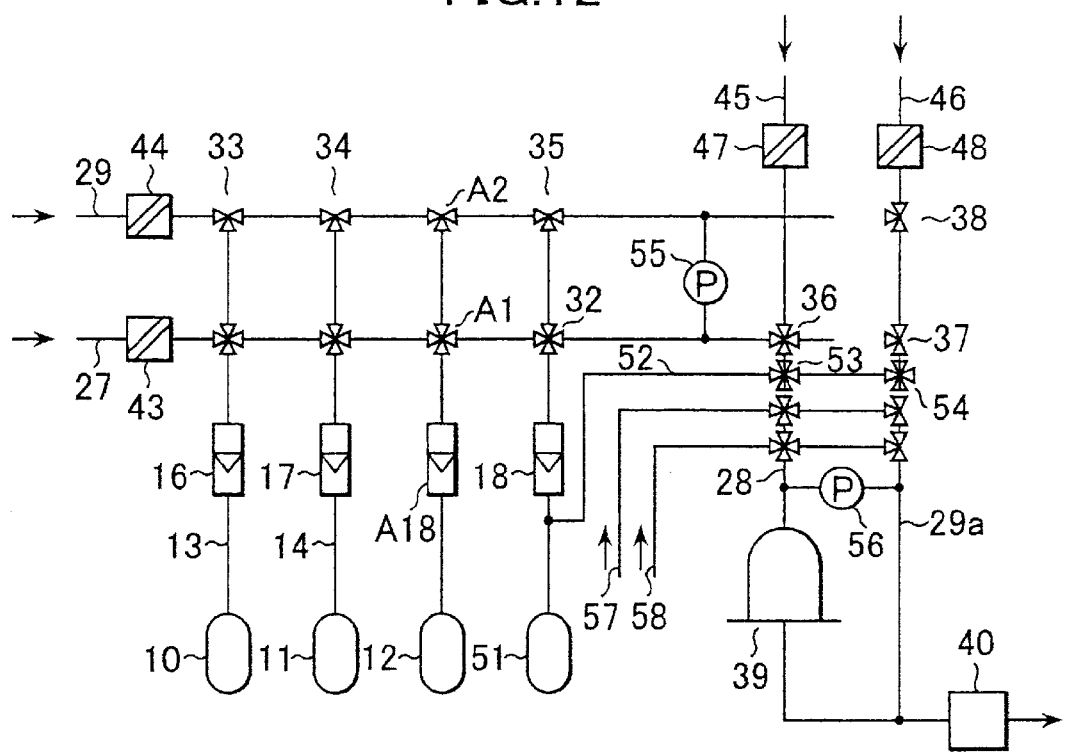
FIG. 12 shows a schematic diagram of the piping system of the vapor deposition apparatus described in Example 3.
Figure 13:
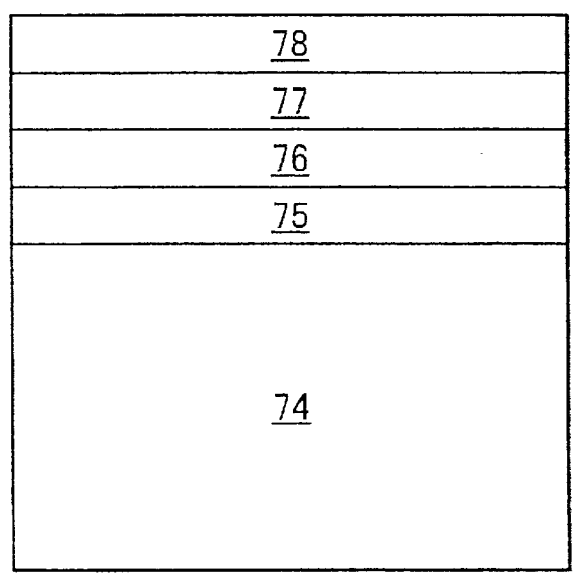
FIG. 13 shows a schematic cross-sectional view of the AlInAs/GaInAs stacked layer structure described in Example 3.

An $Al_{0.48}In_{0.52}As$/$Ga_{0.47}In_{0.53}As$ heterojunction stacked layer structure 73 was formed by use of an ambient-pressure (approximately atmospheric-pressure) MOVPE apparatus shown in FIG. 12 that includes a piping system similar to that of Example 1 (see FIG. 6). FIG. 13 is a schematic representation showing a cross-sectional view of the structure of the stacked layer structure 73.

The piping system includes the dual vent/run mechanism of the present invention. Trimethylgallium (($CH_3)_3Ga$) was employed as a gallium (Ga) source 10, and monovalent cyclopentadienylindium ($C_5H_5In$) was employed as an indium (In) source 11 (see Japanese Patent No. 2098388 (Japanese Patent Publication (kokoku) No. 8-17160), and J. Crystal Growth, 107 (1991), pp. 360–364). Trimethylaluminum (($CH_3$) Al) was employed as an aluminum (Al) source 12. Each of the group III element sources 10 through 12 was provided with a passage for supplying hydrogen carrier gas accompanying the vapor of the source (not shown in FIG. 12). If necessary, hydrogen gas accompanying the vapor of the source 10, 11, or 12 was passed through a first run line 27 or a first vent line 29. The first vent line 29 was brought into connection with a second vent line 29a by opening a three-way valve 38.

Arsine ($AsH_3$) serving as an arsenic (As) source 51 was supplied to the first run line 27 or the first vent line 29 by an opening and closing operation of valves 32 and 35. A line 52 branched from the line for supplying arsine 51 was provided, and the flow of arsine was switched between a second run line 28 and the second vent line 29a by an opening and closing operation of pneumatic-type valves 53 and 54. The group III and V source gasses, which had been mixed in the first run line 27, were passed through the second run line 28 or the second vent line 29a by switching of valves 36 and 37. The second run line 28 was connected directly to a vapor deposition region 39 in which ambient-pressure (approximately atmospheric-pressure) MOVPE was carried out. On the downstream side of the second vent line 29a, an exhaust apparatus 40 for exhausting the source gasses was provided.

A differential pressure gauge 55 was provided for measuring differences in pressure between the first run line 27 and the first vent line 29. Similarly, a differential pressure gauge 56 was provided between the second run line 28 and the second vent line 29a. On the upstream sides of the first vent/run lines 27 and 29 and the second vent/run lines 28 and 29a, electronic mass flow controllers (MFC) 43, 44, 47, and 48, respectively, were provided in order to regulate the flow rate of carrier gas being passed for eliminating differences in pressure between the respective lines. In order to regulate differences in pressure between the first run line 27 and the first vent line 29 at $2 \times 10^2$ Pa or less, hydrogen gas was passed through the MFCs 43 and 44 at a flow rate of about 3–5 liter/minute. Similarly, in order to regulate difference in pressure between the second run line 28 and the second vent line 29a at $2 \times 10^2$ Pa or less, hydrogen gas was passed through the respective lines 28 and 29a at about 5–8 liter/minute in advance.

Subsequently, while phosphine was supplied at a flow rate of 50 cc/minute through a line 57 to the surface of a semi-insulating indium phosphide (InP) single-crystal substrate 74 having a plane direction of {100} 2° off, the substrate was placed in the vapor deposition region 39, and the temperature of the InP substrate 74 was elevated to an epitaxial growth temperature of 640° C.

While the temperature of the substrate 74 was maintained at the above temperature, the flow rate of the indium source 11 accompanied by hydrogen gas was controlled at 60 cc/minute by a flowmeter 17 in order to vapor-grow a highly resistant undoped indium phosphide (InP) buffer layer 75, and then the indium source 11 was passed through the first vent line 29 in advance. The indium source 11 was passed through the second vent line 29a via the first run line 27.

After the temperature of the substrate 74 became consistent, the flow rate of the phosphine gas passing through the line 57 was increased to 250 cc/minute.

Subsequently, the path of the indium source 11 accompanied by hydrogen gas was switched to the first run line 27 by closing a three-way valve 34 provided on the first vent line 29, and simultaneously opening a four-way valve 31 provided on the first run line 27. Three seconds after switching of the path of the indium source, the three-way valve 37 provided on the second vent line 29a was closed, and simultaneously the four-way valve 36 provided on the second run line 28 was opened, and then the source gas was supplied to the vapor deposition region to initiate vapor-growth of the InP buffer layer 75. The indium source 11 and phosphine were continuously supplied to the vapor deposition region 39 until the InP buffer layer 75 was vapor-grown to attain a thickness of about 10 nm. Thereafter, the path of the indium source 11 was switched from the second run line 28 to the second vent line 29a by closing the valve 36 and opening the valve 37 to complete vapor-growth of the InP buffer layer 75.

Even after completion of vapor-growth of the InP buffer layer 75, the phosphine gas was continuously supplied to the vapor deposition region 39 through the line 57 to suppress deterioration of the surface characteristics of the buffer layer 75, which is caused by evaporation of phosphorous (P) gas from the surface.

Subsequently, hydrogen gas for accompanying trimethyl-gallium vapor, which had been passed through the first vent line 29, was passed through the first run line 27 by closing the three-way valve 33 provided on the line 13 for the gallium source 10 and simultaneously opening the four-way valve 30 in order to vapor-grow a $Ga_{0.47}In_{0.53}As$ electron channel layer (channel layer) 76. In addition, the flow rate of the indium source 11 which had been passed through the first run line 27 was regulated to form the $Ga_{0.47}In_{0.53}As$ layer having an indium compositional proportion of 0.53. The flow rate of arsine 51 was regulated by a flowmeter (not shown in FIG. 12) at 250 cc/minute, and the arsine 51 was passed through the first run line 27. The group III element source gasses and the arsenic source gas, which had been mixed in advance, were passed through the second vent line 29a via the first run line 27.

The path of the phosphine 57 was switched from the first run line 28 to the second vent line 29a. Simultaneously, the path of the arsine 51 which had been passed through the second vent line 29a via the line 52 at a flow rate of 50 cc/minute was switched to the second run line 28.

After the group III element source gasses and the arsenic source gas, which had been mixed in advance, were passed through the second vent line 29a for five seconds to attain a consistent flow rate, the three-way valve 37 was closed and the four-way valve 36 was opened to switch the paths of the gasses to the second run line 28. Through this path switching, vapor-growth of the $Ga_{0.47}In_{0.53}As$ channel layer 76 was initiated. When the thickness of the undoped channel layer 76 became 400 nm, the paths of the source gasses were switched from the second run line 28 to the second vent line 29a to complete vapor-growth of the channel layer 76.

Even after completion of vapor-growth of the channel layer 76, the arisine gas 51 was continuously supplied to the vapor deposition region 39 through the line 52 to prevent deterioration of the surface morphology of the channel layer 76, which is caused by evaporation of arsenic gas.

Subsequently, the path of hydrogen gas for accompanying vapor of the aluminum source 12, which had been passed through the first vent line 29, was switched to the first run line 27 by closing a valve A2 and opening a valve A1. Thereafter, in order to vapor-grow an n-type aluminum indium arsenide mixed crystal ($Al_{0.48}In_{0.52}As$) spacer layer 77 and an electron supply layer 78, the flow rates of the aluminum source 12 and the indium source 11 accompanied by hydrogen gas were regulated by flowmeters 17 and A18 to attain the above compositional proportions, and the sources were passed through the first run line 27. The flow rate of the arsine 51 passing through the first run line 27 was regulated to 200 cc/minute. The source gasses mixed in advance were passed through the second vent line 29a before initiation of vapor-growth of the spacer layer 77.

A disilane-hydrogen gas mixture ($Si_2H_6$(10 vol.ppm)-hydrogen gas mixture) serving as a silicon doping source 58 was passed through the second vent line 29a.

Three seconds after the paths of the source gasses mixed in advance was switched to the second vent line 29a, the three-way valve 37 provided on the second vent line 29a was closed, and simultaneously the four-way valve 36 provided on the second run line 28 was opened to initiate vapor-growth of the undoped $Al_{0.48}In_{0.52}As$ spacer layer 77.

When the thickness of the undoped $Al_{0.48}In_{0.52}As$ layer 77 became 4 nm, the path of the disilane gas 58 was switched from the second vent line 29a to the first run line 28. In addition to the group III element sources and the arsenic source, the disilane gas was supplied to the nitride semiconductor vapor deposition region 39 to initiate vapor-growth of an n-type Si-doped $Al_{0.48}In_{0.52}As$ layer 78. Through this vapor-growth procedure, an n-type Si-doped $Al_{0.48}In_{0.52}As$ layer containing carriers in an amount of $2 \times 10^{18}$ cm$^3$; i.e., an electron supply layer 78, was formed. The group III and V source gasses and the doping source 58 were continuously supplied to the vapor deposition region 39 until the electron supply layer 78 was grown to attain a thickness of 10 nm. Thereafter, the paths of the source gasses were switched from the second run line 28 to the. second vent line 29a by closing the valve 36 and opening the valve 37 to complete vapor-growth of the $Al_{0.48}In_{0.52}As$ electron supply layer 78. The path of the disilane gas was switched from the second run line 28 to the second vent line 29a.

Thereafter, while the arsine gas 51 was supplied through the line 52 to the vapor deposition region 39 to suppress evaporation of arsenic (As) gas from the electron supply layer 78, the temperature of the InP substrate 74 was lowered.

The electron mobility of the stacked layer structure 73 measured by means of a customary Hall effect method was 9,200 cm$^2$/V·s at room temperature. The sheet carrier amount ($n_S$) was $7.4 \times 10^{11}$ cm$^{-2}$ at room temperature. At 77 K (the temperature of liquid nitrogen), the electron mobility was 64,000 cm$^2$/V·s, and the sheet carrier amount was $7.9 \times 10^{11}$ cm$^{-2}$.

Figure 14:
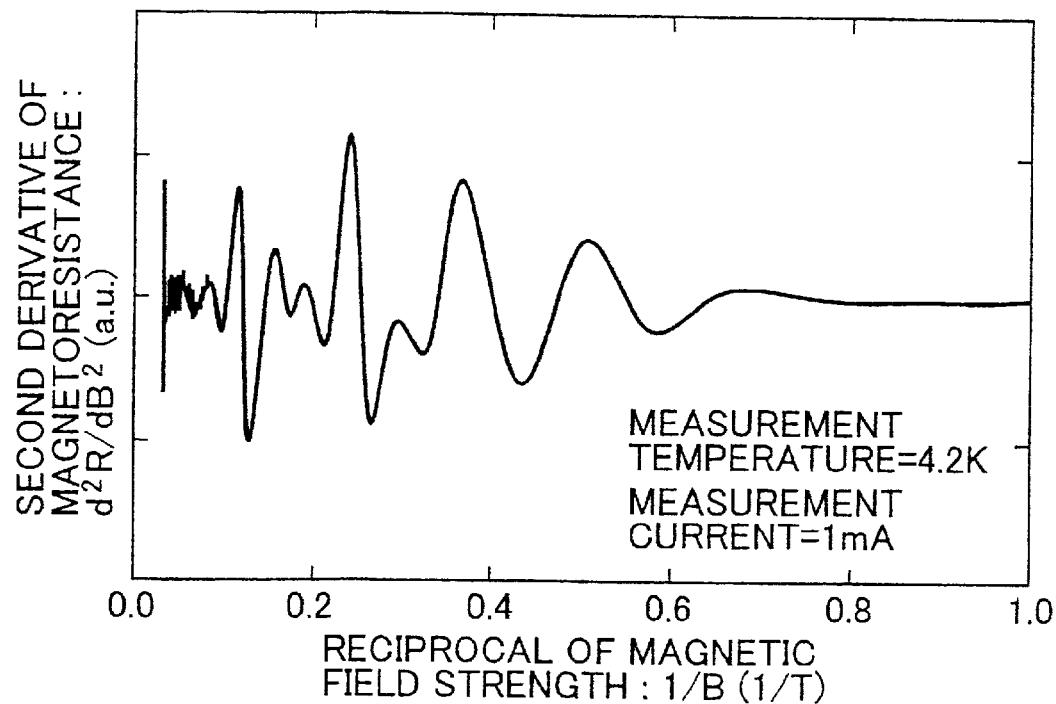
FIG. 14 shows dependence of the second derivative of magneto-resistance on magnetic field strength.

FIG. 14 shows dependence of the second derivative ($d^2R/dB^2$) of magneto-resistance (R) measured at 4.2 K on the reciprocal of magnetic field strength (1/B). As shown in FIG. 14, Shubnikov de Haas (SdH) oscillation of magnetoresistance of large amplitude, which reflects high electron mobility, is observed. The results reveal that, according to the present invention, a heterojunction interface where composition changes sharply such that two-dimensional electron gas is localized is formed between the $Ga_{0.47}In_{0.53}As$ channel layer 76 and the $Al_{0.48}In_{0.52}As$ spacer layer 77. The sheet carrier amount calculated on the basis of the peak of the above second derivative $d^2R/dB^2$ was $7.6\times10^{11}$ cm$^{-2}$, and the thus-calculated amount corresponded well with the aforementioned sheet carrier amount at the temperature of liquid nitrogen (77 K).

Figure 15:
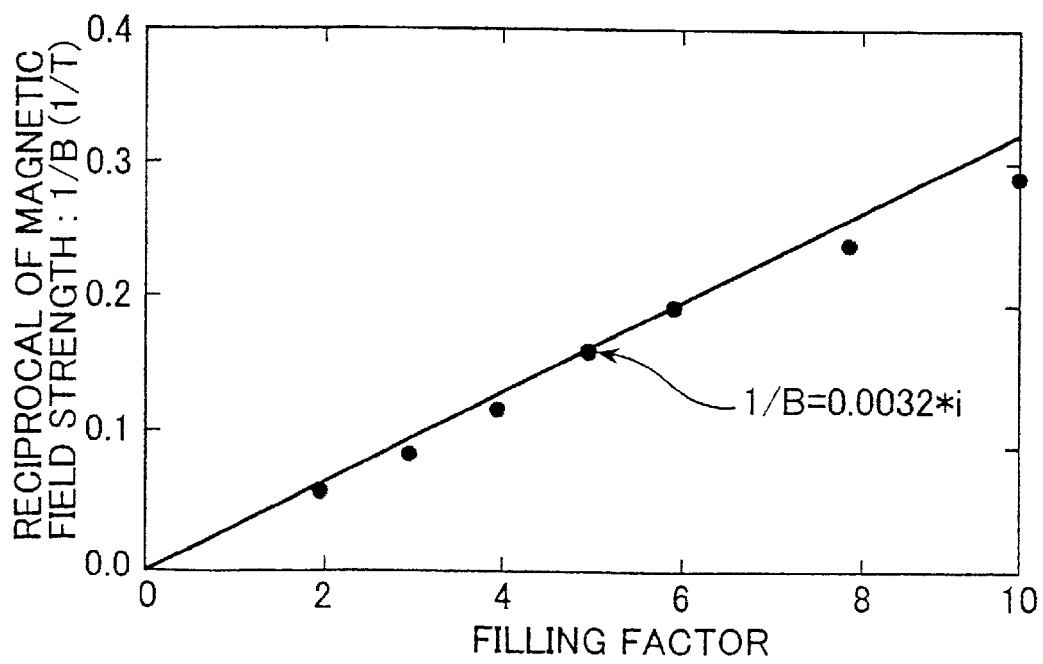
FIG. 15 shows correlation between filling factor and reciprocal of magnetic field strength.

FIG. 15 shows the correlation between filling factor (i) and the reciprocal (1/B) of magnetic field strength (B) (unit: tesla (T)). The filling factor is represented by the formula: $n_s \cdot 2\pi \cdot l^2$ wherein $l_C$ represents a cyclotron radius. In the $Ga_{0.47}In_{0.53}As/Al_{0.48}In_{0.52}As$-type stacked layer structure 73 for producing a TEGFET formed by using the vapor deposition apparatus including the piping system of the present invention, 1/B (unit: 1/T) was $0.032 \cdot i$.

Figure 16:
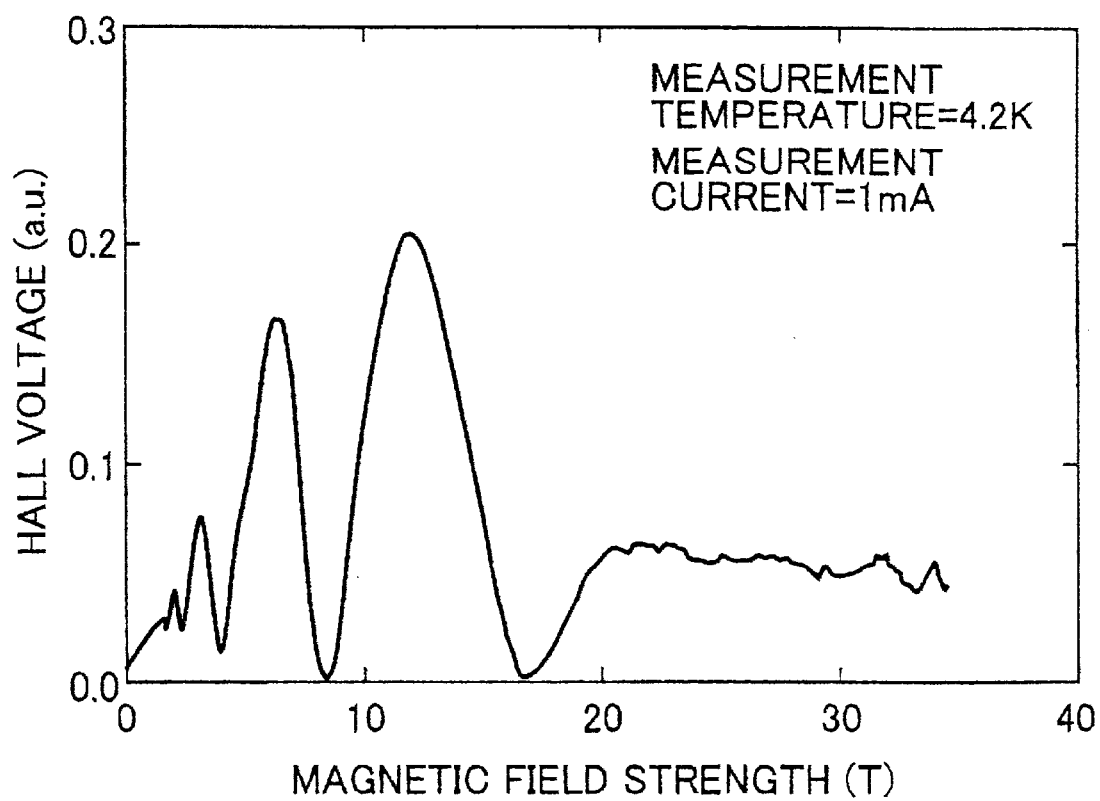
FIG. 16 shows dependence of Hall voltage on magnetic field strength.

FIG. 16 shows dependence of Hall voltage ($R_H$) on the magnetic field strength. The SdH oscillation of the stacked layer structure 73 differs from that of the AlGaAs/GaAs heterojunction-type stacked layer structure for producing a TEGFET. The SdH oscillation of the AlGaAs/GaAs stacked layer structure was attributed to a one simple electron gas-system. Therefore, the SdH oscillation of the stacked layer structure 73 is considered to be attributed to a more complex two-dimensional electron gas-system.

Example 4

In Example 4, the present invention will be described by taking, as an example, production of a Hall device of high product-sensitivity from a stacked layer structure including a gallium indium arsenide ($Ga_{0.47}In_{0.53}As$)/indium phosphide (InP) heterojunction.

Figure 17:
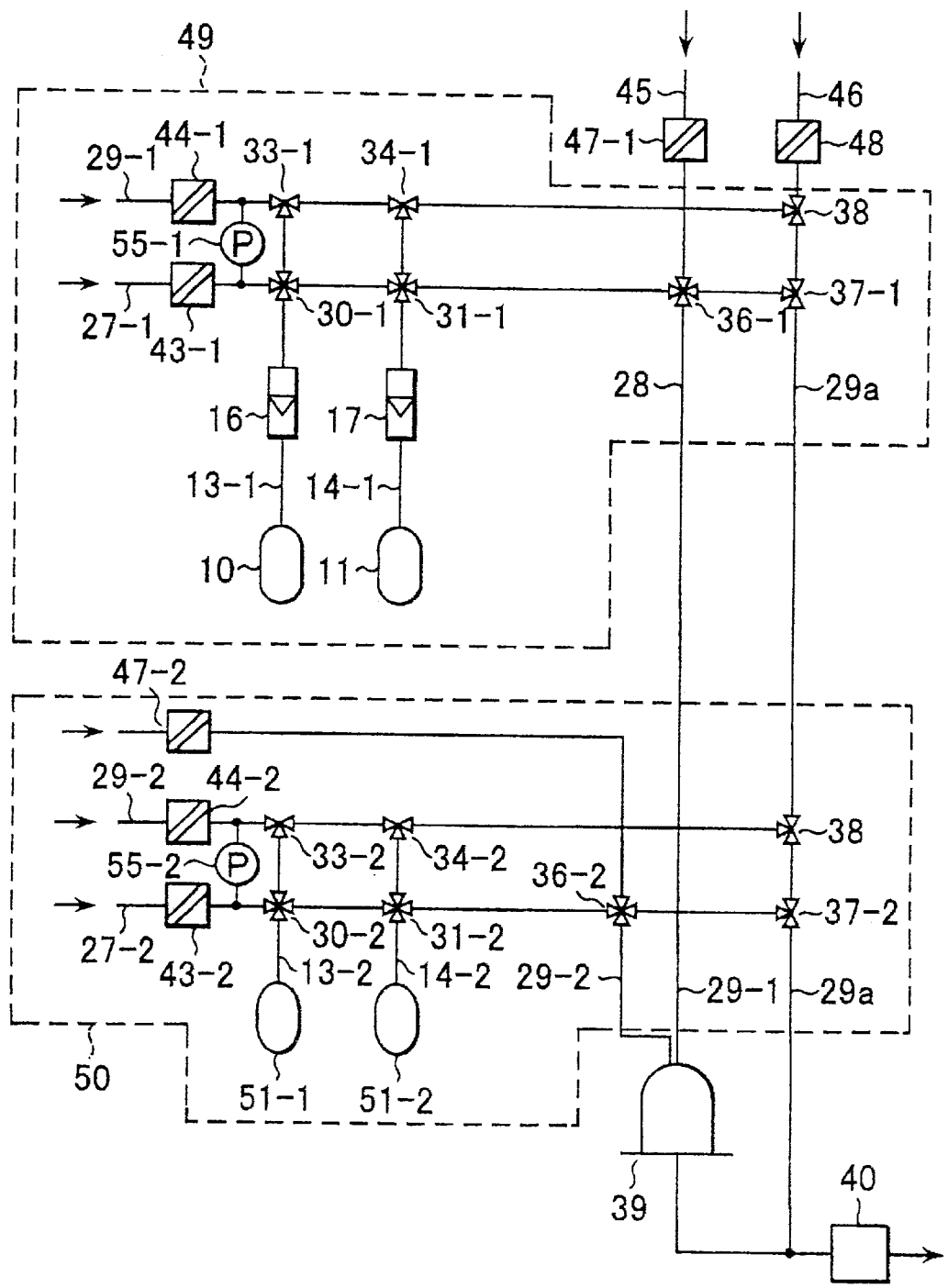
FIG. 17 is a schematic diagram of the piping system of the vapor deposition apparatus described in Example 4.

Example 4 employed a vapor deposition apparatus including a multiple vent/run-type piping system shown in FIG. 17, in which group III and V element sources can be supplied separately, since a heterojunction structure was formed from sources which easily cause polymerization. Since the vapor deposition apparatus employed in Example 4 is similar to that shown in FIG. 3, elements identical with those shown in FIG. 3 are identified by the same reference numerals in FIG. 17. A piping system 49 is provided for supplying group III element sources. A source gas passage 13-1 is provided for supplying trimethylgallium (($CH_3)_3Ga$) serving as a gallium (Ga) source 10. A source gas passage 14-1 is provided for trimethylindium (($CH_3)_3In$) serving as an indium (In) source 11. The path of each of the source gas passages 13-1 and 14-1 is switched between a first run line 27-1 and a first vent line 29-1 by an opening and closing operation of pneumatic-type valves 30-1, 33-1, 31-1, and 34-1. The source gasses, which have been mixed in advance in the first run line 27-1, can be passed through either a second run line 28-1 or a second vent line 29a by switching of valves 36-1 and 371. The second run line 27-1 is not connected to a second run line 27-2 for the group V element source, but is connected directly to a vapor deposition region 39. The first vent line 29-1 in the piping system 49 for supplying the group III element source is detoured away from the vapor deposition region 39 and connected to the second vent line 29a, which is in connection with an exhaust apparatus 40. The piping system 49 for supplying the group III element sources includes electronic mass flow controllers (MFC) 43-1 and 44-1, which are employed to regulate the flow rate of carrier gas for eliminating difference in pressure between the first run line 27-1 and the first vent line 29-1 (the lines are included in the first vent/run piping system).

In the vapor deposition apparatus of Example 4, a piping system 50 for supplying the group V element sources is provided separately from the piping system 49 for supplying the group III element sources. A source gas passage 13-2 is provided for supplying arsine ($AsH_3$) serving as an arsenic (As) source 51-1. A source gas passage 14-2 is provided for supplying phosphine (PHl) serving as a phosphorous (P) source 51-2. For each of the source gas passages 13-2 and 14-2, which are employed for supplying the arsine and phosphine source gasses, respectively, a path is switched between a first run line 27-2 and a first vent line 29-2 by an opening and closing operation of pneumatic-type four-way valves 30-2 and 31-2 and three-way valves 33-2 and 34-2. The source gasses, which have been mixed in advance in the first run line 27-2, can be passed through either the second run line 28-2 or the second vent line 29a by switching of valves 36-2 and 37-2. The second run line 28-2 is connected directly to the vapor deposition region 39. On the upstream sides of the first run line 27-2 and the second vent line 29-2 (the lines are included in the second vent/run piping system), electronic mass flow controllers (MFC) 43-2 and 44-2 are provided, respectively, in order to regulate the flow rate of carrier gas for eliminating difference in pressure between the lines 27-2 and 29-2.

Through use of an MOCVD apparatus having the aforementioned piping systems, an n-type undoped InP layer was vapor-grown on an iron (Fe)-doped semi-insulating (100) indium phosphide (InP) single-crystal substrate 79 having a specific resistance of $3\times10^6 \Omega \cdot cm$. Before vapor-growth of the InP layer, in order to approximately equalize pressure in the first run line 27-1 or 27-2 with that in the first vent line 29-1 or 29-2, hydrogen gas was passed through the piping systems 49 and 50 for supplying the group III and V sources, respectively, the flow rate of the hydrogen gas was regulated by means of the MFCs 43-1, 43-2, 44-1, and 44-2. In order to eliminate differences in pressure between the second run line 28 and the second vent line 29a, hydrogen gas was passed through the lines, and the flow rate of the hydrogen gas being regulated by means of flowmeters 47-1, 47-2, and 48. Subsequently, differences in pressure between the lines 27-1 and 29-1 and difference in pressure between the lines 27-2 and 29-2 were regulated by use of differential pressure gauges 55-1 and 55-2, respectively, to about $5\times10^2$ Pa or less. Consequently, pressure in the first run line 27-1 or 27-2 was approximately equalized with that in the first vent line 29-1 or 29-2. The first and second vent lines 29-1 and 29-2 were connected to the line 29a by opening of valves 38-1 and 38-2 to equalize pressure in the first and second vent line 29-1 and 29-2 and the line 29a. By equalizing differences in pressure between the lines 27-1 and 29-1, between the lines 27-2 and 29-2, and between the lines 28 and 29a, pressure in the first and second run lines 27-1, 27-2, and 28 were equalized.

Under the above-described conditions, phosphine gas (gas mixture of $PH_3$ (10 vol. %) and $H_2$ (90 vol. %)) serving as the phosphorous (P) source 51-2, the flow rate of which was regulated by a flowmeter 17-2 at 40 cc/minute, was passed through the first run line 27-2 via the source gas line 14-2 by opening the valve 31-2 and closing the valve 34-2. The phosphine gas was mixed with hydrogen gas (carrier gas), and the flow rate was regulated by the flow controller 43-2 at 5 liter/minute. By opening the valve 36-2 and closing the valve 37-2, the hydrogen carrier gas containing phosphine was supplied through the second run line 28-2 to the vapor deposition region 39 in a vapor deposition furnace, and the pressure in the region being maintained at approximately atmospheric pressure. While the hydrogen gas containing phosphine was continuously supplied onto the surface of the InP single-crystal substrate 79 placed in the vapor deposition region 39, the InP substrate 79 was heated to 610° C.

In order to vapor-grow an n-type undoped InP buffer layer 80, while the temperature of the InP single-crystal substrate 79 was maintained at the above temperature, hydrogen gas accompanying the vapor of the indium source 11 was passed through the first run line 27-1 in the piping system 49 for supplying the group III element sources by opening the valve 31-1 and closing the valve 34-1. In Example 4, the temperature of the indium source 11 was maintained at 40° C., and the flow rate of the hydrogen gas accompanying the vapor of the indium source 11 was regulated at 70 cc/minute. Hydrogen carrier gas, the flow rate of which was regulated at 1 liter/minute by means of the flow controller 43-1, and the hydrogen gas accompanying the vapor of the indium source 11, which gasses were passed through the first run line 27-1, were discharged to the second vent line 29a by closing the valve 36-1 and opening the valve 37-1.

Subsequently, the flow rate of the phosphine gas, which had been passed through the second run line 27-2 as described above in the piping system 50 for supplying the group V element sources, was increased to 320 cc/minute by means of the flowmeter 17-2.

After consistency in the flow rate of the hydrogen gas accompanying the indium source 11 was confirmed, the valve 37-1 was closed, and simultaneously the valve 36-1 was opened to switch the path of the source gas from the second vent line 29a to the second run line 28-1. Subsequently, the source gas was continuously supplied to the vapor deposition region 39 until the InP buffer layer 80 was vapor-grown to have a thickness of 15 nm. Thereafter, the path of the group III element source gas was switched from the second run line 28-1 to the second vent line 29a by closing the valve 36-1 and opening the valve 37-1 to complete vapor-growth of the InP buffer layer 80.

Even after completion of vapor-growth of the InP buffer layer 80, in order to prevent evaporation of phosphorous gas from the surface of the InP buffer layer 80, the phosphine gas 51-2 was continuously supplied through the second run line 28-2 to the vapor deposition region 39.

Meanwhile, in order to vapor-grow an n-type undoped $Ga_{0.47}In_{0.53}As$ layer 81, the hydrogen gas accompanying the vapor of the gallium source 10, which had been constantly passed through the first vent line 29-1 in advance in the piping system 49 for supplying the group III element source, was passed through the first run line 27-1 by closing the valve 33-1 provided exclusively on the source gas line 13-1 for the gallium source 10 and simultaneously opening the valve 30-1. Through this procedure, the gallium source was mixed, in advance, with the vapor of the indium source 11, which had been passed through the first run line 27-1, and the resultant gas mixture was discharged to the second vent line 29a through the first run line 27-1 while the valve 36-1 was closed and the valve 37-1 was opened.

In the piping system 50 for supplying the group V element sources, the path of the phosphine source 51-2 passing through the source gas passage 14-2 was switched from the first run line 27-2 to the first vent line 29-2 by closing the valve 31-2 provided on the line 14-2 and opening the valve 34-2. That is, supply of the phosphine source 51-2 through the first and second run lines 27-2 and 28-2 to the vapor deposition region 39 was stopped. Instead, the path of arsine gas (gas mixture of $AsH_3$ (10 vol. %) and $H_2$ (90 vol. %)) serving as the arsenic source 51-1, the flow rate of which was regulated by a flowmeter 16-2 provided on the source gas line 13-2 at 280 cc/minute, was switched to the first run line 27-2 by opening the valve 30-2 and closing the valve 33-2.

Immediately after switching of the path of the arsine gas, in the piping system 49 for supplying the group III element source, the path of the gas mixture of the gallium source 10 and the indium source 11, which sources had been mixed in and passed through the first run line 27-1, was switched from the second vent line 29a to the second run line 27-1 by opening the valve 36-1 and closing the valve 37-1. Through this procedure, the group III element sources 10 and 11 were supplied to the vapor deposition region 39 to initiate vapor-growth of the n-type undoped $Ga_{0.47}In_{0.53}As$ layer 81 having a thickness of about 300 nm.

Subsequently, the path of the gas mixture of the group III element sources 10 and 11 was switched from the second run line 28-1 to the second vent line 29a to complete vapor-growth of the $Ga_{0.47}In_{0.53}As$ layer 81.

Thereafter, the temperature of the substrate 79 was lowered. The arsine ($AsH_3$) 51-1 source was continuously supplied to the vapor deposition region 39 until the temperature of the substrate 72 was lowered to about 450° C. to prevent deterioration of the surface morphology of the $Ga_{0.47}In_{0.53}As$ layer 81, which deterioration results from evaporation of arsenic (As) gas.

The sheet carrier amount of the stacked layer structure having the single heterojunction between the undoped InP layer 80 and the undoped $Ga_{0.47}In_{0.53}As$ layer 81, which were formed on the semi-insulating InP substrate 79 through the aforementioned procedures, was $7.1 \times 10^{11}$ $cm^{-2}$ measured by means of a customary Hall effect method. The sheet resistance was 767Ω/□, and the electron mobility was as high as 11,500 $cm^2/V·s$ at room temperature.

The relation between the carrier concentration and the electron mobility (at room temperature) of a stacked layer structure having the single heterojunction between an InP layer and a $Ga_{0.47}In_{0.53}As$ layer, which was formed on a semi-insulating InP substrate 72 in a manner similar to that described above by use of the vapor deposition apparatus of Example 4 shown in FIG. 17 will be shown. According to the present invention, a heterojunction structure having an electron mobility in excess of 9,000 $cm^2/V·s$ within a carrier amount range of $1 \times 10^{16}$ $cm^{-3}$ to $4 \times 10^{16}$ $cm^3$ is consistently formed.

Example 5

Through the procedure described in Example 3, a stacked layer structure 82 having the single heterojunction between the undoped InP layer 80 and the undoped $Ga_{0.47}In_{0.53}As$ layer 81, which were formed on the semi-insulating InP substrate 79 was formed.

Figure 18:
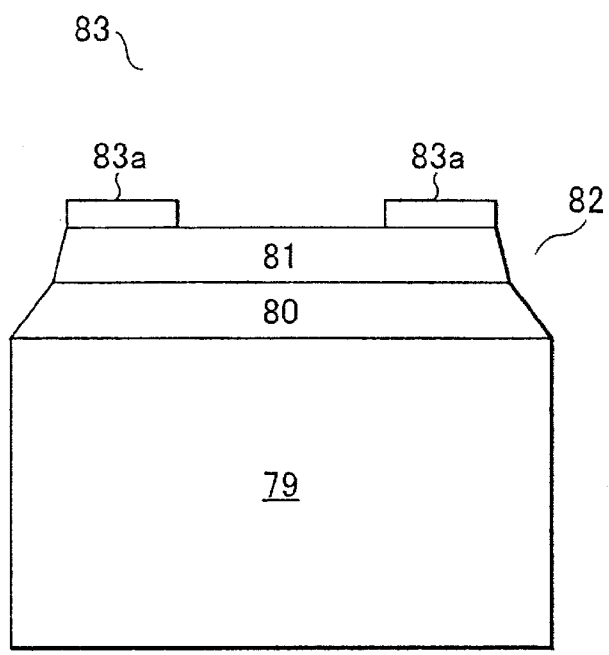
FIG. 18 shows a schematic cross-sectional view of an InP/GaInAs heterojunction Hall device.

An InP/$Ga_{0.47}In_{0.53}As$ heterojunction Hall device 83 was formed from the stacked layer structure 82 containing carriers in an amount of $8.1 \times 10^{16}$ $cm^{-3}$ and having an electron mobility as high as 11,300 $cm^2/V·s$ at room temperature. FIG. 18 shows a schematic cross-sectional view of the resultant Hall device 83. The Hall device 83 was formed using a mesa-type magneto-sensitive portion which was formed from the undoped InP layer 80 and the $Ga_{0.47}In_{0.53}As$ layer 81 through wet-etching (see Japanese Patent Application Laid-Open (kokai) No. 7-99349). Ohmic electrodes 83a for input of operation power and output of Hall voltage were formed from a gold (Au)-germanium (Ge) alloy.

The input resistance and product-sensitivity of the Hall device 83 were 1,400Ω and 880 V/A·T, respectively. The product-sensitivity was about 15% or more higher than that of a conventional InP/Ga$_{0.47}$In$_{0.53}$As heterojunction Hall device (=760 V/A·T), which has an input resistance of less than 2.5 kΩ (see the above IEEE Trans. Electron Dev., ED-41 (3)).

Example 6

InP/Ga$_{0.47}$In$_{0.53}$As stacked layer structures differing in carrier amount and electron mobility were formed through the vapor-growth process described in Example 3, and were subjected to the same procedure as described in Example 4 (see Japanese Patent Application Laid-Open (kokai) No. 6-268277) to produce Heterojunction Hall devices 83.

Figure 19:
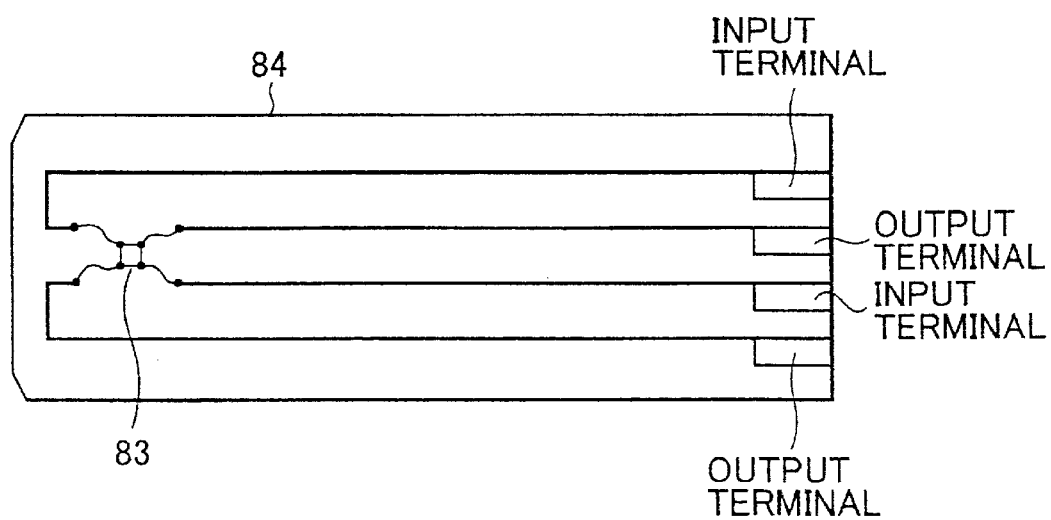
FIG. 19 shows a schematic plan view of a Hall probe for measuring magnetic field strength.

Probes for measuring magnetic field strength were produced from Hall devices 83 of different input resistance, and the differences in input resistance between the devices were caused by differences in carrier amount and electron mobility between the devices. FIG. 19 shows a schematic plan view of the probe 84 for measuring magnetic field strength.

Figure 20:
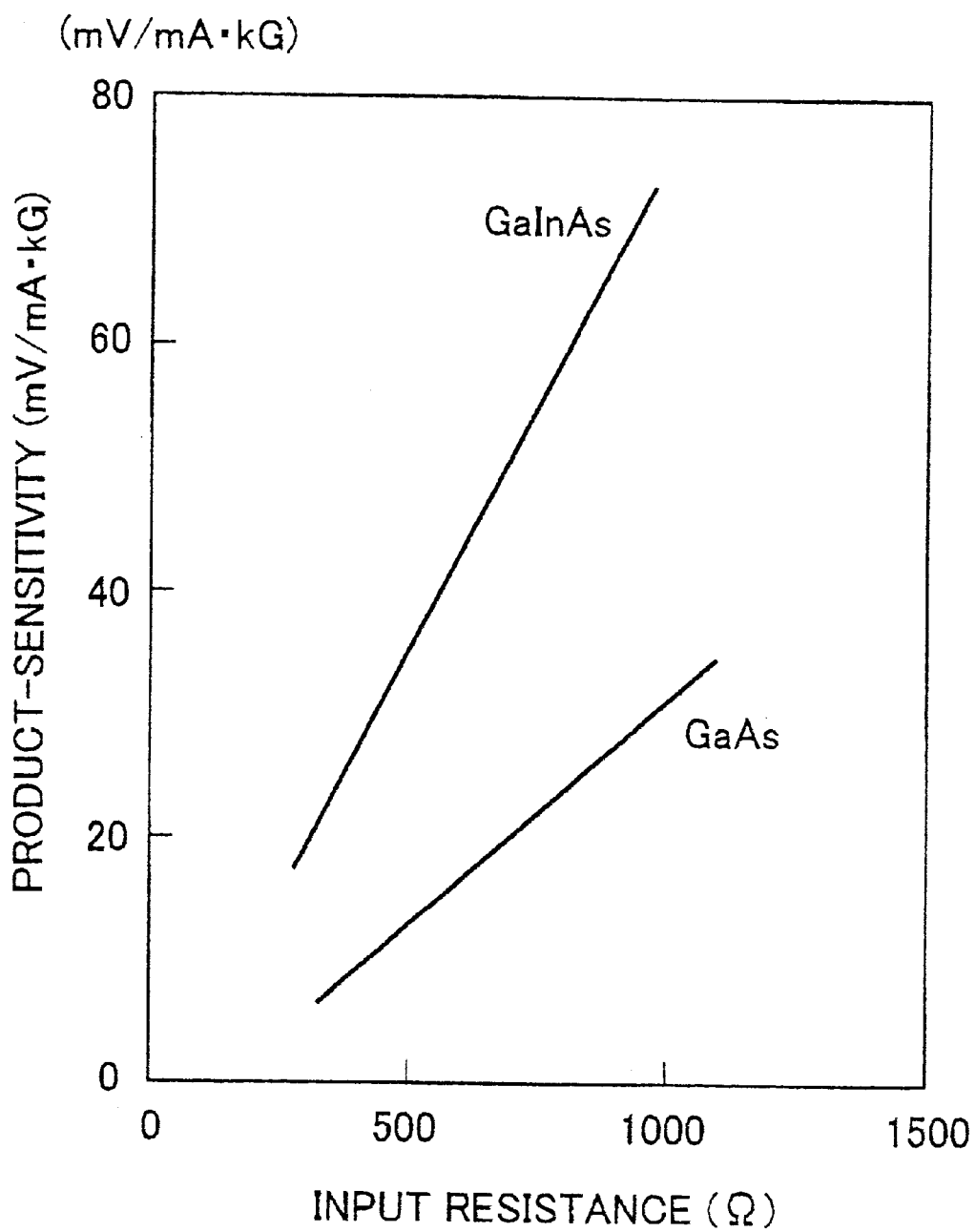
FIG. 20 shows the correlation between input resistance and product-sensitivity of the Hall probe.

FIG. 20 shows the correlation between the input resistance and the product-sensitivity of the probe. For comparison, FIG. 20 also shows the product-sensitivity of a probe produced from a conventional GaAs Hall device in which a magneto-sensitive portion consists of GaAs (see, for example, Sensors and Actuators A, 32 (1992), pp. 651–655).

The results reveal that the probe 84 produced from the heterojunction Hall device 83 of the present invention has high product-sensitivity at any input resistance compared with the probe produced from the conventional GaAs Hall device. Therefore, according to the present invention, a probe for measuring magnetic field strength which has product-sensitivity about 2.5 times that of the probe produced from the conventional GaAs Hall device can be provided, even when these probes have the same input resistance (e.g., 500Ω).

Example 7

The present invention will be described in detail by taking, as an example, production of a shortwave visible light-emitting diode (LED) from a stacked layer structure including a gallium indium nitride (GaInN)/GaN double heterojunction structure serving as a light-emitting portion where the structure was formed by means of the vapor deposition apparatus of the present invention.

Figure 21:
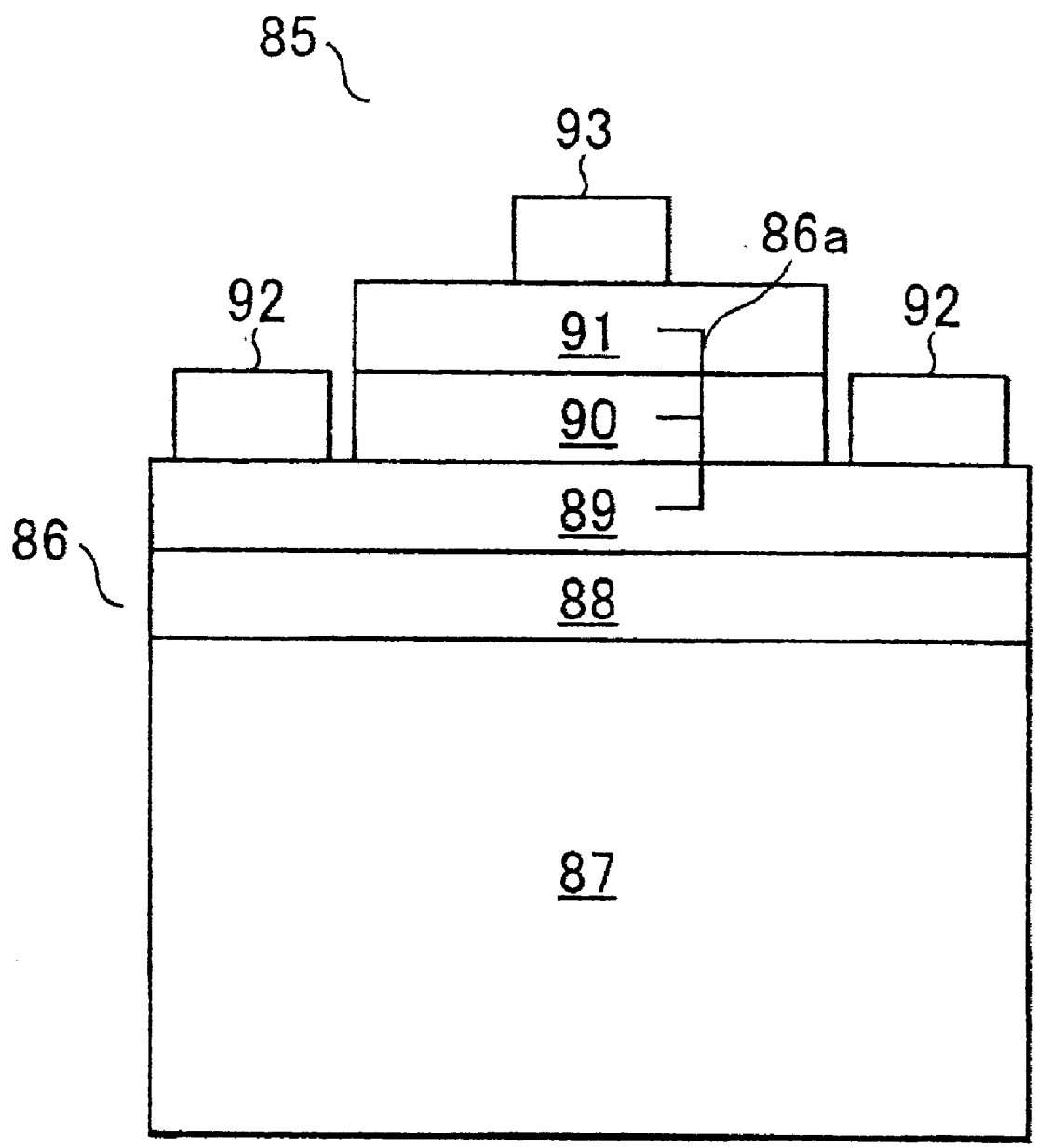
FIG. 21 shows a schematic cross-sectional view of a GaInN LED.

FIG. 21 shows a schematic cross-sectional view of a GaInN LED 85 of the present invention.

Figure 22:
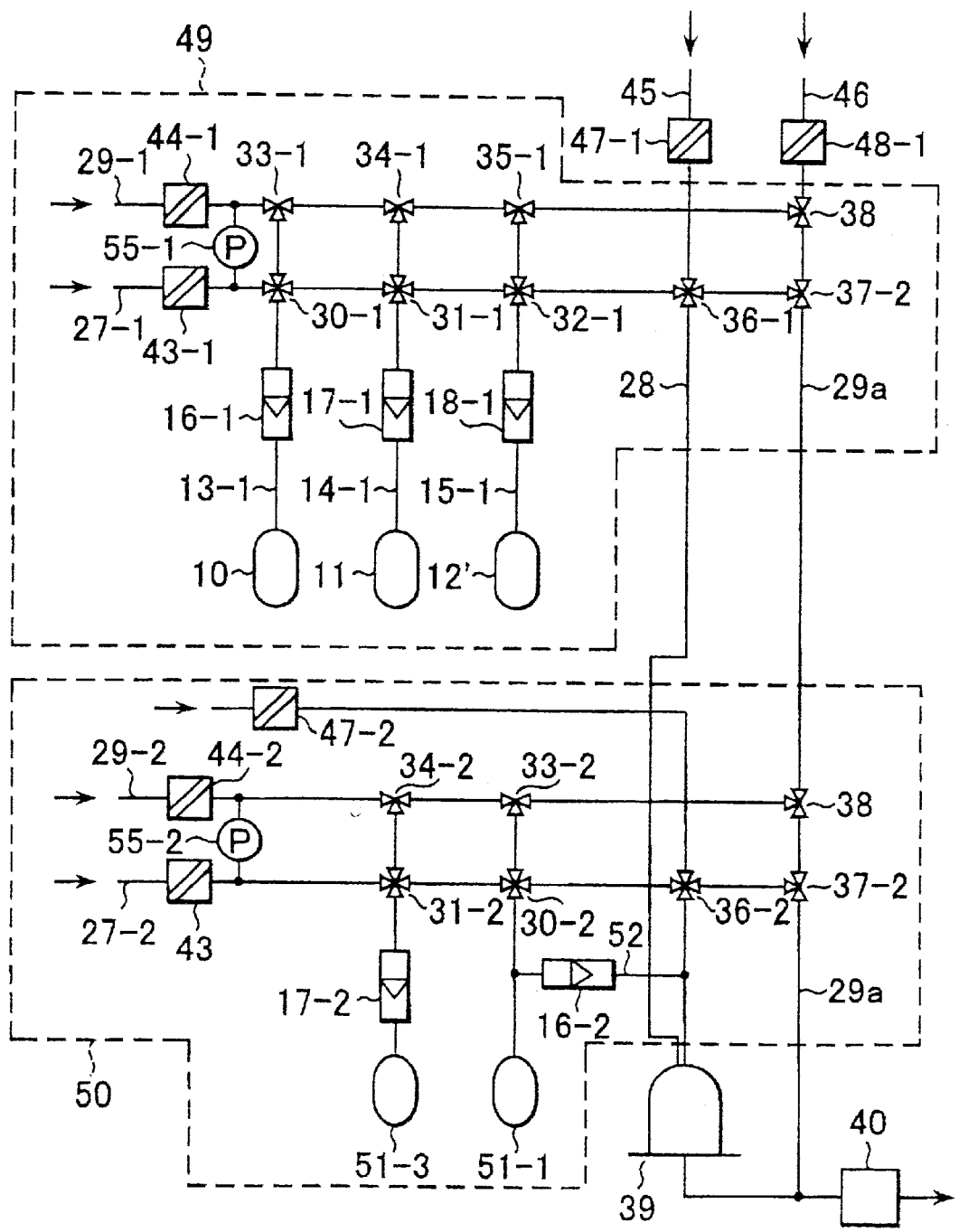
FIG. 22 shows a schematic diagram of the piping system of the vapor deposition apparatus described in Example 7.

A stacked layer structure 86 for producing the LED 85 was formed by means of a double vent/run-type vapor deposition apparatus shown in FIG. 22. The vapor deposition apparatus employed in Example 7 consists of the piping system shown in FIG. 17 and of the piping system shown in FIG. 5 in which volatile group V element sources can be supplied to the vapor deposition region at any time.

Ammonia (NH$_3$) was employed as a nitrogen (N) source 51-1. On a source gas passage 13-2 for passing ammonia gas, a line 52 for passing ammonia gas via a flowmeter 16-2 through a second run line 28-2 or a second vent line 29a at any time was provided. A disilane-hydrogen gas mixture (Si$_2$H$_6$: 5 vol.ppm) 51-3, serving as a doping gas of silicon (Si), was supplied through a source gas passage 14-2 of a piping system 50 for supplying a group V element source.

In a piping system 49 for supplying group III element sources, trimethylgallium ((CH$_3$)$_3$Ga) and trimethylindium ((CH$_3$)$_3$In) were employed as a gallium (Ga) source 10 and an indium (In) source 11, respectively. The group III element sources 10 and 11 were accompanied by hydrogen gas and passed through run lines 27-1 and 28-1 or vent lines 29-1 and 29a via source gas passages 13-1 and 14-1.

Before vapor-growth of a low-temperature buffer layer 88, the flow rate of ammonia gas 51 which passes through source gas passage 13-2 was regulated by the flowmeter 16-2 at 0.5 liter/minute, and the ammonia gas was supplied through a first run line 27-2 and the second run line 28-2 to a vapor deposition region 39 in which a sapphire substrate 81 had been placed. In addition, the ammonia gas 51, the flow rate of which was regulated by a flowmeter 16-3 at 0.5 liter/minute, was passed through the line 52 and the first run line 28-2. Hydrogen gas, the flow rate of which was regulated by a flowmeter 47-2 at 5 liter/minute, was passed through the second run line 28-2. Furthermore, hydrogen gas, the flow rate of which was regulated by a flowmeter 48, was passed through the second vent line 29a to regulate difference in pressure between the line 29a and the second run line 28-2 to 2×10$^2$ Pa or less. While the hydrogen gas and the ammonia gas were passed, the temperature of the sapphire substrate 87 was elevated to 420° C.

After the temperature of the substrate 87 was maintained at 420±1° C., the path of hydrogen gas accompanying the vapor of the trimethylgallium 10, which gas had been passed through the first vent line 29-1 in advance, was switched from the first vent line 29-1 to the first run line 27-1 by an opening and closing operation of valves 30-1 and 33-1. Subsequently, by an opening and closing operation of valves 36-1 and 37-1, the path of the hydrogen gas accompanying the gallium source 10 was switched from the second vent line 29a to the second run line 28-1. Thereafter, the gallium source 10 and the ammonia gas 51-1 were supplied to the vapor deposition region 39 for eight minutes to vapor-grow the undoped GaN low-temperature buffer layer 88 to a thickness of 17 nm. Vapor-growth of the low-temperature buffer layer 88 having a metallographical grain structure as disclosed in a patent issued to the present inventor (see Japanese Patent No. 3031255) was completed by switching the path of the hydrogen gas accompanying the gallium source 10 from the second run line 28-1 to the second vent line 29a.

Passage of the ammonia gas through the first run line 27-2 was temporarily stopped by closing a four-way valve 30-2 and a three-way valve 33-2. Meanwhile, the ammonia gas 51-1 was continuously supplied to the vapor deposition region 39 through the line 52. While the vapor deposition region 39 was maintained in an atmosphere of ammonia, the temperature of the substrate 87 was elevated from 420° C. to 1080° C. within about one minute.

While the temperature of the substrate 87 was elevated to 1080° C., the flow rate of the ammonia gas 51-1 passing through the passage 13-2 was regulated by the flowmeter 16-2 at 8 liter/minute, and the ammonia gas was passed through the second vent line 29a.

While the temperature of the substrate 87 was maintained at 1080±2° C., the flow rate of hydrogen gas for accompanying the gallium source 10, the temperature of which was maintained at 0° C., was increased to 20 cc/minute, and the hydrogen gas was passed through the second vent line 29a via the first run line 27-1 in advance.

The disilane gas, the flow rate of which was regulated by a flowmeter 17-2 at 10 cc/minute, was supplied from the doping gas source 51-3 to the first run line 27-2 via the source gas passage 14-2.

The path of hydrogen gas accompanying the ammonia gas and the disilane gas was switched from the second vent line 29a to the second run line 28-2. While a mixture of the ammonia gas (flow rate: 8 l/min.), the disilane gas (flow rate: 10 cc/min.), and the hydrogen gas (flow rate: 5 l/min.) was passed through the second run line 28-2 to the vapor deposition region 89, which had been evacuated to about $8 \times 10^3$ Pa, the path of the hydrogen gas accompanying the gallium source 10 was switched from the second vent line 29a to the second run line 28-1 to deposit an Si-doped n-type GaN lower cladding layer 83 on the low-temperature buffer layer 88. The amount of carriers contained in the lower cladding layer 89 was $3.2 \times 10^{18}$ cm$^{-3}$, and the thickness of the layer was about 3.0 μm. Vapor-growth of the GaN lower cladding layer 89 was completed by switching the path of the gas accompanying the gallium source 10 from the second run line 28-1 to the second vent line 29a.

Simultaneously, the path of the mixture of the ammonia gas 51-1 (flow rate: 8 l/min.), the disilane gas 51-3 (flow rate: 10 cc/min.), and the hydrogen gas (flow rate: 5 l/min.), which was passed through the second run line 28-2, was switched to the second vent line 29a. Subsequently, the path of the disilane gas was switched from the first run line 27-2 to the first vent line 29-2.

The ammonia gas 51-1 was continuously supplied through the line 52 to the vapor deposition region 39 to suppress evaporation of nitrogen (N) gas from the GaN layer 89 during intermission of vapor-growth. Simultaneously, the temperature of the sapphire substrate 87 was lowered from 1080° C. to 890° C. within about one minute.

While the temperature of the substrate 87 was lowered, the path of the hydrogen gas accompanying the vapor of the indium source 11, which had been passed through the first vent line 29-1 in advance at a predetermined flow rate, was switched to the first run line 27-1. Subsequently, the gallium source 10 and the indium source 11 were mixed in advance in the first run line 27-1 to attain gallium indium nitride having an average compositional ratio of indium (In) of 0.12 (Ga$_{0.88}$In$_{0.12}$N), and the sources were passed through the line 27-1. Until five seconds elapsed after the hydrogen gas accompanying the vapor of the indium source 11 was fed to the first run line 27-1, these sources were passed through the second vent line 29a to attain consistent mixing ratio of the sources.

The path of the ammonia gas 51-1 was switched from the first vent line 29-2 to the first run line 27-2, and simultaneously the ammonia gas, the flow rate of which was regulated to 8 liter/minute, was again supplied through the second run line 28-2 to the vapor deposition region 39. The paths of the group III element source gasses which had been mixed in advance were switched from the second vent line 29a to the second run line 28-1 to initiate vapor-growth of a Ga$_{0.88}$In$_{0.12}$N light-emitting layer 90. The metallographical grain structure of the Ga$_{0.88}$In$_{0.12}$N light-emitting layer 90 was a multi-phase structure consisting of a plurality of phases differing in indium compositional ratio, and the structure is disclosed in patents issued to the present inventors (see GB Patent No. 2316226B, U.S. Pat. No. 5,886,367, and Taiwanese Patent No. 099672). Vapor-growth of the Ga$_{0.88}$In$_{0.12}$N light-emitting layer 90 having a thickness of 10 nm was completed by stopping the supply of the mixture of the gallium source 10 and the indium source 11 to the vapor growth region 39.

The ammonia gas 51-1 was continuously supplied to the vapor deposition region 39 through the first run line 27-2 and through the second run line 28-2 via the line 52 to prevent loss of the light-emitting layer 90, which would otherwise be caused by sublimation of the multi-phase Ga$_{0.88}$In$_{0.12}$N. While supply of the ammonia gas was continued, the temperature of the sapphire substrate 87 was elevated from 890° C. to 1050° C.

During elevation of the temperature of the substrate, hydrogen gas accompanying the vapor of the indium source 11 was discharged through the first vent line 29-1 by closing the valve 31-1 and opening the valve 34-1. The flow rate of hydrogen accompanying the vapor of the gallium source 10 was changed, and the hydrogen gas was passed through the second vent line 29a via the first run line 27-1. Meanwhile, by use of the run line 15-1, the path of hydrogen gas accompanying bis-cyclopentadienylindium (bis-(C$_5$H$_5$)$_2$Mg) 12' serving as a p-type dopant, which had been exhausted through the first and second vent lines 29-1 and 29a in advance, was switched from the first vent line 29-1 to the first run line 27-1 by closing a three-way valve 35-1 and opening a four-way valve 32-1.

Subsequently, the path of a mixture of the gallium source 10 and the magnesium (Mg) source 12', which had been mixed in the first run line 27-1 and passed therethrough in advance, was switched from the second vent line 29a to the second run line 28-1. Through this procedure, the gallium source 10 and the magnesium source 12' were supplied to the vapor deposition region 39 to which the ammonia gas 51-1 had been supplied via the run line 28-2 to initiate vapor-growth of a Mg-doped p-type GaN layer 91. The source gasses were continuously supplied for a predetermined time to vapor-grow the p-type GaN layer 91 containing carriers in an amount of $3 \times 10^{17}$ cm$^3$ and having a thickness of 10 nm. Vapor-growth of the p-type GaN layer 91 was completed by switching the paths of the gallium source 10 and the magnesium source 12' from the second run line 28-1 to the second vent line 29a.

One minute after completion of vapor-growth, the path of the ammonia gas 51-1 being passed through the second run line 28-2 was switched to the second vent line 29a. While the ammonia gas 51-1 was continuously supplied through the line 52 to the vapor deposition region 39, the temperature of the sapphire substrate 87 was lowered from 1050° C. to 950° C. at a rate of 50° C./minute. Subsequently, the temperature of the substrate 87 was lowered to 650° C. at a rate of 115° C./minute. When the temperature of the substrate 87 was lower than 650° C., the valve 36-2 was closed and the valve 37-2 was opened to stop supply of the ammonia gas 51-1 through the line 52. Thereafter, the thus-formed stacked layer structure 86 was cooled to room temperature by natural cooling.

A light-emitting portion 86a including the stacked layer structure 86 of double heterojunction structure was formed of the Si-doped n-type GaN lower cladding layer 89, the Ga$_{0.88}$In$_{0.12}$N light-emitting layer 90 consisting of a multi-phase structure of different indium composition, and the Mg-doped p-type GaN upper cladding layer 91. Measurement by means of customary secondary ion mass spectroscopy (SIMS) revealed that the transition distance of an indium atom (see Japanese Patent Application Laid-Open (kokai) No. 11-168241) from the junction interface between the light-emitting layer 90 and the upper cladding layer 91 to the inside of the layer 91 was about 10 nm. The results show a sharp change of composition at the junction interface, which is necessary for obtaining shortwave emission of high intensity (see the above Japanese Patent Application Laid-Open (kokai) No. 11-168241).

A matrix phase mainly constituting the light-emitting layer 90 of multi-phase structure predominantly contained GaN since the compositional ratio of indium was low. Therefore, the light-emitting layer 90 and the lower cladding layer 89 formed a heterojunction structure satisfying discontinuity or junction on the conduction band side, which is necessary for high-intensity emission (see Japanese Patent No. 2992933).

The stacked layer structure 86 was subjected to customary plasma etching to remove some regions of the upper cladding layer 91 and the light-emitting layer 90, and then n-type ohmic electrodes 92 were formed on the regions. A p-type ohmic electrode 93 was formed on the upper cladding layer 91 to produce the LED 85 (see Japanese Patent Application Laid-Open (kokai) No. 10-107315).

Figure 23:
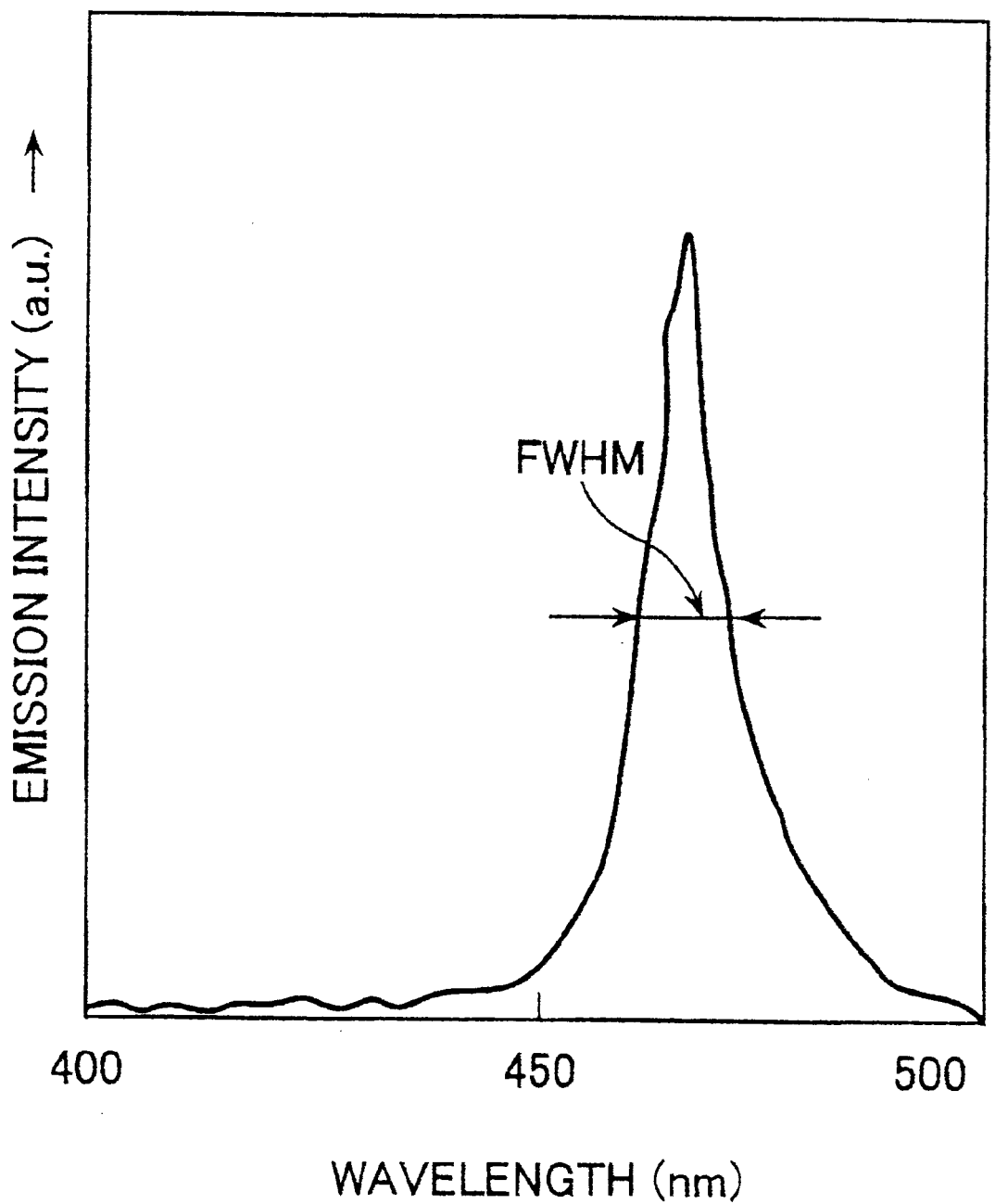
FIG. 23 shows an emission spectrum of the GaInN LED described in Example 7.

When a forward current of 20 mA was applied to the LED 85, blue light of wavelength of about 460 nm was emitted from the LED 85. When forward current was 20 mA, forward voltage was 3.8 V. FIG. 23 shows the emission spectrum of the LED. Sharp change of composition at the junction interface between the light-emitting layer 90 and the upper cladding layer 91 results in excellent full width half maximum (FWHM) of the emission spectrum; i.e., 10 nm. The luminous intensity of a chip of the LED 85 encapsulated with a general epoxy resin for encapsulating a semiconductor device was about 1.2 candela (cd). According to the present invention, a GaInN light-emitting device of high emission intensity was provided, the FWHM of the emission spectrum of the device being small; i.e., emission from the device exhibited excellent monochromaticity.

According to the vapor deposition apparatus including run lines of the present invention, source gasses can be supplied to a vapor deposition region at consistent composition proportions, and thus a semiconductor junction interface where composition changes sharply can be formed.

According to the vapor deposition apparatus including a mechanism for passing a carrier gas through vent lines, and differential pressure gauges between vent lines and run lines, differences in pressure between the run lines connected to the vapor deposition region and the vent lines can be lowered. Therefore, variance in the flow rate of the source gas during switching of the path of the source gas can be lowered, and thus a semiconductor junction interface where composition changes sharply can be reliably formed.

According to the vapor deposition apparatus including two or more mechanisms for switching the path of source gasses between the vent line and the run line connected directly to the vapor deposition region, a semiconductor junction interface where compositional proportions of the sources are consistent and composition changes sharply can be formed, even when a complex combination of sources having high association reactivity is employed.

In the vapor deposition apparatus including the run lines, when a hydride of a group V or VI element having a low boiling point is employed as a source gas, condensation of the source gas can be prevented even when the group V or VI element source is placed far from the vapor deposition region. Therefore, a group III-V compound semiconductor inxed-crystal layer in which compositional proportions are consistent and which has a junction interface where composition changes sharply can be produced. Since condensation of source gas can be prevented, volatile element sources can be supplied constantly to the vapor deposition region, and a layer exhibiting good surface morphology is effectively grown.

According to the vapor deposition apparatus of the present invention, a stacked layer structure having a heterojunction interface where composition changes sharply and exhibiting high electron mobility is provided. Therefore, for example, a GaInP/GaInAs two-dimensional electron gas field effect transistor exhibiting excellent transconductance can be produced. In addition, a heterojunction Hall device of high product-sensitivity can be formed from an InP/GaInAs heterojunction stacked layer structure exhibiting high electron mobility. Furthermore, a highly sensitive Hall probe for measuring magnetic field strength can be produced from the InP/GaInAs heterojunction stacked layer structure of the present invention, which has high product-sensitivity.

A light-emitting device exhibiting excellent monochromaticity of light emission can be produced from a stacked layer structure having a junction interface where composition changes sharply, and formed through the vapor deposition process of the present invention. For example, a GaInN shortwave visible LED, the emission spectrum band thereof being narrowed, can be produced.

While the invention has been described in detail and with reference to specific embodiments thereof, it will be apparent to one skilled in the art that various changes and modifications can be made therein without departing from the spirit and scope thereof.

What is claimed is:

1. A vapor deposition apparatus for producing a stacked layer structure in which semiconductor crystal layers are laminated on a substrate material, which apparatus comprises:

two or more vapor deposition sources respectively provided with source gas passages which are connected to a first run line and a first vent line:

the first run line for mixing the vapor deposition source gases in advance and passing the resultant source mixture gas;

the first vent line for supplying the source gas to the outside of a vapor deposition region in advance to maintain a constant flow rate of the gas:

line switching mechanisms provided on the each source gas passage for switching the flow of the source gas from the first run line to the first vent line and vice versa:

a second run line for supplying the source mixture gas to the vapor deposition region;

a second vent line for allowing the source mixture gas to detour away from the vapor deposition region and exhausting the source mixture gas; and a line switching mechanism provided between the first run line and the second run line or the second vent line for switching the flow of the source mixture gas passing through the first run line from the second run line to the second vent line and vice versa.

2. A vapor deposition apparatus according to claim 1, wherein the second vent line has a mechanism for passing a carrier gas.

3. A vapor deposition apparatus according to claim 1 or 2, wherein the apparatus further comprises an apparatus for measuring differences in pressure between the second vent line and the second run line.

4. A vapor deposition apparatus according to claim 1 or 2, wherein the vapor deposition sources contain a hydride of group V or VI element.

* * * * *